(12) United States Patent
Hu et al.

(10) Patent No.: US 11,562,982 B2
(45) Date of Patent: Jan. 24, 2023

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Chih-Chia Hu, Taipei (TW); Ming-Fa Chen, Taichung (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/398,159

(22) Filed: Apr. 29, 2019

(65) Prior Publication Data

US 2020/0343218 A1    Oct. 29, 2020

(51) Int. Cl.
*H01L 25/065* (2006.01)
*H01L 23/00* (2006.01)
*H01L 21/683* (2006.01)
*H01L 25/00* (2006.01)

(52) U.S. Cl.
CPC ...... *H01L 25/0652* (2013.01); *H01L 21/6835* (2013.01); *H01L 23/562* (2013.01); *H01L 24/08* (2013.01); *H01L 24/80* (2013.01); *H01L 25/50* (2013.01); *H01L 2221/68354* (2013.01); *H01L 2224/08145* (2013.01); *H01L 2224/80895* (2013.01); *H01L 2224/80896* (2013.01); *H01L 2225/06513* (2013.01); *H01L 2225/06524* (2013.01); *H01L 2225/06548* (2013.01); *H01L 2225/06586* (2013.01); *H01L 2924/3511* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

OTHER PUBLICATIONS

"Three Chips Stacking with Low Volume Solder Using Single Re-Flow Process" by Khan et al. (Year: 2010).*
"Microspheres as Bond Line Spacers in Epoxies" (Year: 2021).*

*Primary Examiner* — Evren Seven
(74) *Attorney, Agent, or Firm* — JCIPRNET

(57) ABSTRACT

Provided are integrated circuit packages and methods of forming the same. An integrated circuit package includes an integrated circuit structure, a first die stack and a dummy die. The first die stack includes a plurality of first die structures and is bonded to the integrated circuit structure at a first side of the first die stack. The dummy die includes a plurality of through substrate vias, is located aside the first die stack and is electrically connected to the integrated circuit structure at the first side of the first die stack. In some embodiments, the height of the through substrate vias of the dummy die is the same as the height of the first die stack.

20 Claims, 20 Drawing Sheets

(56) References Cited

U.S. PATENT DOCUMENTS

| | | | |
|---|---|---|---|
| 9,559,081 B1* | 1/2017 | Lai | H01L 21/568 |
| 9,666,502 B2 | 5/2017 | Chen et al. | |
| 9,735,131 B2 | 8/2017 | Su et al. | |
| 9,768,133 B1* | 9/2017 | Wu | H01L 23/481 |
| 9,806,015 B1* | 10/2017 | Sung | H01L 25/0652 |
| 9,806,058 B2* | 10/2017 | Wei | H01L 24/17 |
| 10,262,911 B1* | 4/2019 | Gong | H01L 24/09 |
| 2002/0094661 A1* | 7/2002 | Enquist | H01L 21/2007 |
| | | | 438/455 |
| 2011/0170266 A1* | 7/2011 | Haensch | H01L 24/92 |
| | | | 361/722 |
| 2013/0307119 A1* | 11/2013 | Chen | H01L 24/05 |
| | | | 257/532 |
| 2015/0021785 A1* | 1/2015 | Lin | H01L 25/0657 |
| | | | 257/774 |
| 2015/0103521 A1* | 4/2015 | Mustafa | F21K 9/23 |
| | | | 362/227 |
| 2015/0235949 A1* | 8/2015 | Yu | H01L 21/76802 |
| | | | 257/774 |
| 2017/0018529 A1* | 1/2017 | Katkar | H01L 25/0652 |
| 2017/0053844 A1* | 2/2017 | Tsai | H01L 23/538 |
| 2017/0084576 A1* | 3/2017 | Yu | H01L 21/76885 |
| 2017/0103973 A1* | 4/2017 | Yu | H01L 21/4853 |
| 2017/0162542 A1* | 6/2017 | Chen | H01L 25/50 |
| 2017/0301650 A1* | 10/2017 | Yu | H01L 23/481 |
| 2018/0102251 A1* | 4/2018 | Delacruz | H01L 21/82 |
| 2018/0254260 A1* | 9/2018 | Wei | H01L 24/03 |
| 2019/0326252 A1* | 10/2019 | Mandalapu | H01L 24/03 |
| 2019/0385977 A1* | 12/2019 | Elsherbini | H01L 25/50 |
| 2020/0135594 A1* | 4/2020 | Lee | H01L 24/73 |
| 2020/0135684 A1* | 4/2020 | Kim | H01L 23/481 |
| 2020/0258857 A1* | 8/2020 | Huo | H01L 24/08 |
| 2020/0335480 A1* | 10/2020 | Hwang | H01L 25/03 |

* cited by examiner

INTEGRATED CIRCUIT PACKAGES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuit (3DIC) packages, wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1:
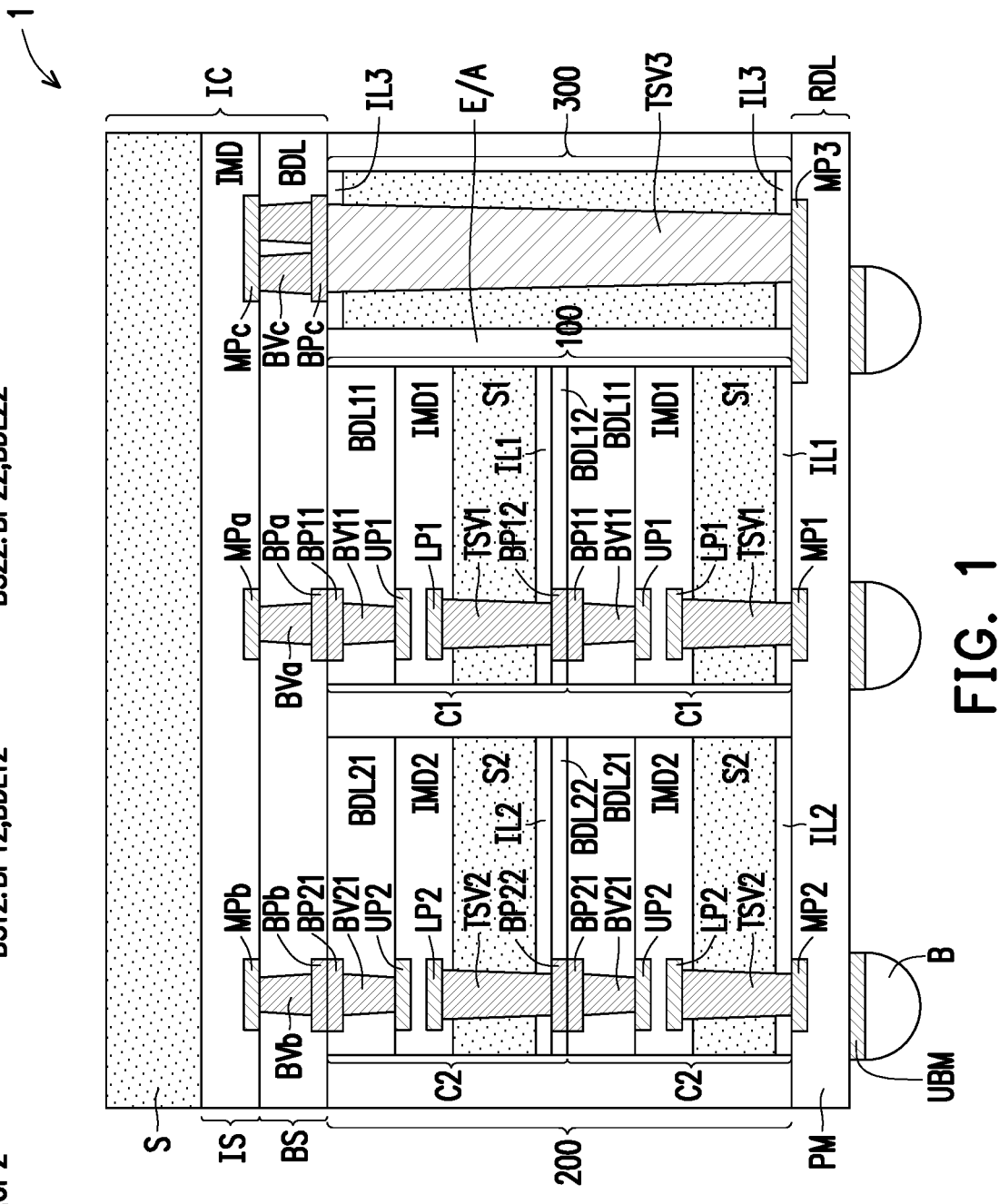
FIG. 1 is a cross-sectional view of an integrated circuit package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of an integrated circuit package in accordance with some embodiments. It is understood that the disclosure is not limited by the structure described below. Additional features can be added in the structure and some of the features described below can be replaced or eliminated, for additional embodiments of the structure.

Referring to FIG. 1, an integrated circuit package 1 includes an integrated circuit structure IC, a first die stack 100, an optional second die stack 200 and a dummy die 300. The integrated circuit structure IC may include one or more functional devices such as active components and/or passive components. In some embodiments, the integrated circuit structure IC may include a logic die, a memory die, a CPU, a GPU, an xPU, a MEMS die, a SoC die, or the like. In some embodiments, the integrated circuit structure IC includes a semiconductor substrate S, an interconnect structure IS and a bonding structure BS.

The semiconductor substrate S includes an elementary semiconductor such as silicon, germanium and/or a compound semiconductor such as silicon germanium, silicon carbide, gallium arsenic, indium arsenide, gallium nitride or indium phosphide. The semiconductor substrate S may include a silicon-containing material. For example, the semiconductor substrate S is a silicon-on-insulator (SOI) substrate or a silicon substrate. In various embodiments, the semiconductor substrate S may take the form of a planar substrate, a substrate with multiple fins, nanowires, or other forms known to people having ordinary skill in the art. Depending on the requirements of design, the semiconductor substrate S may be a P-type substrate or an N-type substrate and may have doped regions therein. The doped regions may be configured for an N-type device or a P-type device. In some embodiments, the semiconductor substrate S may have one or more through substrate vias (e.g., through silicon vias) upon the process requirements. The semiconductor substrate S includes isolation structures defining at least one active area, and at least one device is disposed on/in the active area. In some embodiments, the device includes a gate dielectric layer, a gate electrode, source/drain regions, spacers, and the like.

The interconnect structure IS may be disposed over a first side (e.g., front side) of the semiconductor substrate S. Specifically, the interconnect structure IS may be disposed over and electrically connected to the device. In some embodiments, the interconnect structure IS includes inter-metal dielectric layers IMD and metal features embedded in the inter-metal dielectric layers IMD. The inter-metal dielectric layers IMD may include silicon oxide, silicon oxynitride, silicon nitride, a low dielectric constant (low-k) material having a dielectric constant less than 3, a combination thereof or the like. The metal features may include Cu, Ti, Ta, W, Ru, Co, Ni, a combination thereof or the like. In some embodiments, a seed layer and/or a barrier layer may be disposed between each metal feature and the corresponding inter-metal dielectric layer IMD. The seed layer may include Ti/Cu. The barrier layer may include Ta, TaN, Ti, TiN, CoW or a combination thereof. In some embodiments, the metal features include top metal pads MPa, MPb and MPc configured to electrically connect to different components. In some embodiments, the width of the top metal pads MPc may be different from (e.g., greater than) the width of the top metal pads MPa or MPb. In alternative embodiments, the width of the top metal pads MPc may be the same as the width of the top metal pads MPa or MPb.

The bonding structure BS may be disposed over the first side (e.g., front side) of the semiconductor substrate S. Specifically, the bonding structure BS may be disposed over and electrically connected to the interconnect structure IS. In some embodiments, the bonding structure BS includes at least one bonding dielectric layer BDL and bonding metal features embedded in the bonding dielectric layer BDL. In some embodiments, the bonding dielectric layer BDL includes silicon oxide, silicon nitride, a polymer or a combination thereof. In some embodiments, the bonding metal features include bonding pads BPa, BPb and BPc and bonding vias BVa, BVb and BVc. Specifically, as shown in FIG. 1, the bonding pad BPa and the bonding via BVa are electrically connected to the first die stack 100, the bonding pad BPb and the bonding via BVb are electrically connected the second die stack 200, and the bonding pad BPc and the bonding via BVc are electrically connected to the dummy die 300. The bonding metal features may include Cu, Ti, Ta, W, Ru, Co, Ni, a combination thereof or the like. In some embodiments, a seed layer and/or a barrier layer may be disposed between each bonding metal feature and the bonding dielectric layer BDL. The seed layer may include Ti/Cu. The barrier layer may include Ta, TaN, Ti, TiN, CoW or a combination thereof.

Referring to FIG. 1, the first die stack 100 is bonded to the integrated circuit structure IC at a first side (e.g., front side) of the first die stack 100. In some embodiments, the first die stack 100 is bonded to the integrated circuit structure IC in a face-to-face configuration, as shown in FIG. 1. However, the disclosure is not limited thereto, and another face-to-back configuration or back-to-back configuration may be applied.

The first die stack 100 includes a plurality of first die structures C1 vertically stacked. Each of the first die structures C1 may include one or more functional devices such as active components and/or passive components. In some embodiments, each of the first die structures C1 may include a logic die, a memory die, a CPU, a GPU, an xPU, a MEMS die, a SoC die, or the like. In some embodiments, each of the first die structures C1 includes a semiconductor substrate S1, an interconnect structure IS1 and at least one bonding structure.

The semiconductor substrate S1 may be similar to the semiconductor substrate S, so the material and configuration thereof may refer to those of the semiconductor substrate S. In some embodiments, the semiconductor substrate S1 includes isolation structures defining at least one active area, and at least one device is disposed on/in the active area. In some embodiments, the semiconductor substrate S1 may have one or more through substrate vias (e.g., through silicon vias) TSV1. The through substrate via TSV1 may include Cu, Ti, Ta, W, Ru, Co, Ni, a combination thereof or the like. In some embodiments, a seed layer and/or a barrier layer may be disposed between each through substrate via TSV1 and the semiconductor substrate S1. The seed layer may include Ti/Cu. The barrier layer may include Ta, TaN, Ti, TiN, CoW or a combination thereof. In some embodiments, the top portion of the through substrate via TSV1 extends into the interconnect structure IS1, and the bottom portion of the through substrate via TSV1 is surrounded by an insulating layer IL1. The insulating layer IL1 may include silicon oxide or a suitable dielectric material.

The interconnect structure IS1 may be similar to the interconnect structure IS, so the material and configuration thereof may refer to those of the interconnect structure IS. In some embodiments, the interconnect structure IS1 may be disposed over a first side (e.g., front side) of the semiconductor substrate S1. Specifically, the interconnect structure IS1 is disposed over and electrically connected to the device. In some embodiments, the interconnect structure IS1 includes inter-metal dielectric layers IMD1 and metal features embedded in the inter-metal dielectric layers IMD1. In some embodiments, the metal features include an upper pad UP1 configured to bond to a bonding structure BS11, and a lower pad LP1 configured for the through substrate via TSV1 to land thereon.

The bonding structure BS11 may be similar to the bonding structure BS, so the material and configuration thereof may refer to those of the bonding structure BS. In some embodiments, the bonding structure BS11 may be disposed over the first side (e.g., front side) of the semiconductor substrate S1. Specifically, the bonding structure BS11 may be disposed over and electrically connected to the interconnect structure IS1. In some embodiments, the bonding structure BS11 includes at least one bonding dielectric layer BDL11 and at least one bonding metal feature embedded in the bonding dielectric layer BDL11. In some embodiments, the at least one bonding metal feature includes a bonding pad BP11 and a bonding via BV11. Specifically, as shown in FIG. 1, the bonding pad BP11 and the bonding via BV11 of one first die structure C1 are electrically connected to the bonding structure BS of the integrated circuit structure IC or the bonding structure BS12 of another first die structure C1.

In some embodiments, the first die structure C1 may optionally include a bonding structure BS12 disposed over the second side (e.g., back side) of the semiconductor substrate S1. In some embodiments, the bonding structure BS12 includes at least one bonding dielectric layer BDL12 and at least one bonding metal feature embedded in the bonding dielectric layer BDL12. In some embodiments, the bonding metal feature includes a bonding pad BP12. Specifically, as shown in FIG. 1, the bonding pad BP12 of one first die structure C1 is electrically connected to the bonding structure BS11 of another first die structure C1.

In some embodiments, the first die stack 100 is bonded to the integrated circuit structure IC through a hybrid bonding including a metal-to-metal bonding and a dielectric-to-dielectric bonding. Specifically, the bonding pad BP11 of the first die stack 100 is bonded to the bonding pad BPa of the integrated circuit structure IC, and the bonding dielectric layer BDL11 of the first die stack 100 is bonded to the bonding dielectric layer BDL of the integrated circuit structure IC.

In the first die stack 100, the first die structures C1 are stacked in a face-to-back configuration, as shown in FIG. 1. However, the disclosure is not limited thereto, and another face-to-face configuration and/or back-to-back configuration may be applied. Besides, the embodiments in which the first die stack 100 has two die structures are provided for illustration purposes, and are not construed as limiting the present disclosure. The number of the die structures of the first die stack 100 is not limited by the disclosure.

In some embodiments, the two adjacent first die structures C1 are bonded to each other through a hybrid bonding including a metal-to-metal bonding and a dielectric-todielectric bonding. Specifically, the bonding pad BP11 of one first die structure C1 is bonded to the bonding pad BP12 of another first die structure C1, and the bonding dielectric layer BDL11 of one first die structure C1 is bonded to the bonding dielectric layer BDL12 of another first die structure C1.

In some embodiments, the topmost first die structure C1 of the first die stack 100 close to the integrated circuit structure IC has two bonding structures BS11 and BS12 at the front and back sides thereof, and the lowermost first die structure C1 of the first die stack 100 away from the integrated circuit structure IC has one bonding structure BS11 at the front side thereof. In the first die stack 100, the middle first die structure, if any, between the topmost and lowermost first die structures C1 has two bonding structures BS11 and BS12 at the front and back sides thereof.

Referring to FIG. 1, the second die stack 200 is bonded to the integrated circuit structure IC at the first side (e.g., front side) of the first die stack 100. In some embodiments, the second die stack 200 is bonded to the integrated circuit structure IC in a face-to-face configuration, as shown in FIG. 1. However, the disclosure is not limited thereto, and another face-to-back configuration or back-to-back configuration may be applied.

The second die stack 200 may be similar to the first die stack 100, and the material and configuration thereof may refer to those of the first die stack 100. The second die stack 200 includes a plurality of second die structures C2 vertically stacked. Each of the second die structures C2 may include one or more functional devices such as active components and/or passive components. In some embodiments, each of the second die structures C2 may include a logic die, a memory die, a CPU, a GPU, an xPU, a MEMS die, a SoC die, or the like. The second die structure C2 may be similar to the first die structure C1, and the material and configuration thereof may refer to those of the first die structure C1. In some embodiments, each of the second die structures C2 includes a semiconductor substrate S2, an interconnect structure IS2 and at least one bonding structure.

The function of the second die stack 200 and/or the second die structure C2 may be different from that of the first die stack 100 and/or the first die structure C1. For example, one of the first and second die stacks is a logic stack, and the other of the first and second die stacks is a memory stack. The first and second die stacks may have similar function as needed. Besides, upon the process requirements, the dimension of the second die stack 200 and/or the second die structure C2 may be similar to or different from the dimension of the first die stack 100 and/or the first die structure C1. The dimension may be a height, a width, a size, a top-view area or a combination thereof.

The semiconductor substrate S2 may be similar to the semiconductor substrate S1, so the material and configuration thereof may refer to those of the semiconductor substrate S1. In some embodiments, the semiconductor substrate S2 includes isolation structures defining at least one active area, and at least one device is disposed on/in the active area. In some embodiments, the semiconductor substrate S2 may have one or more through substrate vias (e.g., through silicon vias) TSV2. In some embodiments, the top portion of the through substrate via TSV2 extends into the interconnect structure IS2, and the bottom portion of the through substrate via TSV2 is surrounded by an insulating layer IL2. The insulating layer IL2 may include silicon oxide or a suitable dielectric material.

The interconnect structure IS2 may be similar to the interconnect structure IS1, so the material and configuration thereof may refer to those of the interconnect structure IS1. In some embodiments, the interconnect structure IS2 may be disposed over a first side (e.g., front side) of the semiconductor substrate S2. Specifically, the interconnect structure IS2 is disposed over and electrically connected to the device. In some embodiments, the interconnect structure IS2 includes inter-metal dielectric layers IMD2 and metal features embedded in the inter-metal dielectric layers IMD2. In some embodiments, the metal features include an upper pad UP2 configured to bond to a bonding structure BS21, and a lower pad LP2 configured for the through substrate via TSV2 to land thereon.

The bonding structure BS21 may be similar to the bonding structure BS11, so the material and configuration thereof may refer to those of the bonding structure BS11. In some embodiments, the bonding structure BS21 may be disposed over the first side (e.g., front side) of the semiconductor substrate S2. Specifically, the bonding structure BS21 may be disposed over and electrically connected to the interconnect structure IS2. In some embodiments, the bonding structure BS21 includes at least one bonding dielectric layer BDL21 and at least one bonding metal feature embedded in the bonding dielectric layer BDL21. In some embodiments, the at least one bonding metal feature includes a bonding pad BP21 and a bonding via BV21. Specifically, as shown in FIG. 1, the bonding pad BP21 and the bonding via BV21 of one second die structure C2 are electrically connected to the bonding structure BS of the integrated circuit structure IC or the bonding structure BS22 of another second die structure C2.

In some embodiments, the second die structure C2 may optionally include a bonding structure BS22 disposed over the second side (e.g., back side) of the semiconductor substrate S2. In some embodiments, the bonding structure BS22 includes at least one bonding dielectric layer BDL22 and at least one bonding metal feature embedded in the bonding dielectric layer BDL22. In some embodiments, the bonding metal features include a bonding pad BP22. Specifically, as shown in FIG. 1, the bonding pad BP22 of one second die structure C2 is electrically connected to the bonding structure BS21 of another second die structure C2.

In some embodiments, the second die stack 200 is bonded to the integrated circuit structure IC through a hybrid bonding including a metal-to-metal bonding and a dielectric-to-dielectric bonding. Specifically, the bonding pad BP21 of the second die stack 200 is bonded to the bonding pad BPb of the integrated circuit structure IC, and the bonding dielectric layer BDL21 of the second die stack 200 is bonded to the bonding dielectric layer BDL of the integrated circuit structure IC.

In the second die stack 200, the second die structures C2 are stacked in a face-to-back configuration, as shown in FIG. 1. However, the disclosure is not limited thereto, and another face-to-face configuration and/or back-to-back configuration may be applied. Besides, the embodiments in which the second die stack 200 has two die structures are provided for illustration purposes, and are not construed as limiting the present disclosure. The number of the die structures of the second die stack 200 is not limited by the disclosure.

In some embodiments, the two adjacent second die structures C2 are bonded to each other through a hybrid bonding including a metal-to-metal bonding and a dielectric-to-dielectric bonding. Specifically, the bonding pad BP21 of one second die structure C2 is bonded to the bonding pad BP22 of another second die structure C2, and the bonding dielectric layer BDL21 of one second die structure C2 is bonded to the bonding dielectric layer BDL22 of another second die structure C2.

In some embodiments, the topmost second die structure C2 of the second die stack 200 close to the integrated circuit structure IC has two bonding structures BS21 and BS22 at the front and back sides thereof, and the lowermost second die structure C2 of the second die stack 200 away from the integrated circuit structure IC has one bonding structure BS21 at the front side thereof. In the second die stack 200, the middle second die structure, if any, between the topmost and lowermost second die structures C2 has two bonding structures BS21 and BS22 at the front and back sides thereof.

Referring to FIG. 1, the dummy die 300 is located aside the first die stack 100 and/or the second die stack 200 and electrically connected to the integrated circuit structure IC at the first side (e.g., front side) of the first die stack 100.

Herein, a dummy die indicates a non-operating die, a die configured for non-use, a die without devices therein or a die used only to electrically couple together two other dies in the die stack. In some embodiments, a dummy die is substantially free of any active devices or functional devices, such as transistors, capacitors, resistors, diodes, photodiodes, fuse devices and/or other similar devices. In some embodiments, a dummy die can be constructed without an active component, a passive component or both. In some embodiments, the dummy die is called a "device-free die" through the specification. However, a dummy die may include at least one conductive feature electrically connected to the adjacent die(s). In some embodiments, the at least one conductive feature includes a through substrate via, a metal line, a metal plug, a metal pad or a combination thereof. Specifically, the dummy die can function as an electrical connector between adjacent dies. In some embodiments, the dummy die of the disclosure can be utilized to stiffen the package and protect the package against deformation. In some embodiments, the dummy die of the disclosure can be configured to reduce coefficient of thermal expansion (CTE) mismatch and improve the warpage profile of the resulting package.

In some embodiments, the dummy die 300 includes a semiconductor substrate S3 and one or more through substrate vias TSV3. In some embodiments, when the semiconductor substrate S3 includes silicon, the through substrate vias TSV3 can be referred to as through silicon vias. In some embodiments, the semiconductor substrate S3 includes a material similar to that of the semiconductor substrate S2 or the semiconductor substrate S1, so as to mitigate CTE mismatch between the first die stack 100 and the second die stack 200. In some embodiments, the semiconductor substrate S3 is substantially free of doped regions or isolation structures. The semiconductor substrate S3 is much thicker than the semiconductor substrate S2 or the semiconductor substrate S1. For example, the height of the semiconductor substrate S3 is at least 3 times the height of semiconductor substrate S2 or the semiconductor substrate S1, so as to effectively mitigate the CTE mismatch between die stacks.

The through substrate via TSV3 penetrates through the semiconductor substrate S3. The through substrate via TSV3 may be electrically to the bonding pad BPc and the bonding via BVc of the integrated circuit structure IC. The through substrate via TSV3 may include Cu, Ti, Ta, W, Ru, Co, Ni, a combination thereof or the like. In some embodiments, a continuous seed layer and/or a continuous barrier layer may be disposed between the through substrate via TSV3 and the semiconductor substrate S3. The continuous seed layer may include Ti/Cu. The continuous barrier layer may include Ta, TaN, Ti, TiN, CoW or a combination thereof. An insulating liner may be disposed between the through substrate via TSV3 and the continuous seed layer or the continuous barrier layer. The through substrate via TSV3 may have a smoothly inclined sidewall. However, the disclosure is not limited thereto. In some embodiments, the through substrate via TSV3 may have a substantially vertical sidewall.

In some embodiments, the height of the through substrate via TSV3 of the dummy die 300 is the same as the height of the first die stack 100 and/or the second die stack 200. Specifically, the top and bottom surfaces of the through substrate via TSV3 of the dummy die 300 are substantially coplanar to the top and bottom surfaces of the first die stack 100 and/or the second die stack 200, respectively.

In some embodiments, the dummy die 300 further includes two insulating layers IL3 respectively surrounding the top and bottom portions of the through substrate via TSV3. The insulating layers IL3 may include silicon oxide or a suitable dielectric material.

In some embodiments, the width of the through substrate via TSV3 is about 5 to 50 times (e.g., 10 times to 30 times) the width of the through substrate via TSV1 or through substrate via TSV2. In some embodiments, the width of the through substrate via TSV3 ranges from about 10 μm to 15 μm, and the depth of the through substrate via TSV3 ranges from about 20 μm to 100 μm.

Referring to FIG. 1, a redistribution layer structure RDL is further included in the integrated circuit package 1. The redistribution layer structure RDL is formed over the second sides (e.g., back sides) of the first die stack 100 and the second die stack 200. The second side is opposite to the first side of the first die stack 100 or the second die stack 200. The redistribution layer structure RDL includes at least one polymer layer PM and conductive features embedded by the polymer layer PM. The conductive features include metal pads MP1, MP2 and MP3 configured to electrically connect to different components. In some embodiments, the metal pad MP1 is electrically connected to the through substrate vias TSV1 of the first die stack 100, the metal pad MP2 is electrically connected to the through substrate vias TSV2 of the second die stack 200, and the metal pad MP3 is electrically connected to the through substrate vias TSV3 of the dummy die 300. In some embodiments, the polymer layer PM may include a photo-sensitive material such as polybenzoxazole (PBO), polyimide (PI), benzocyclobutene (BCB), a combination thereof or the like. The polymer layer of the redistribution layer structure RDL may be replaced by a dielectric layer or an insulating layer as needed. In some embodiments, the metal pads MP1, MP2 and MP3 may include Cu, Ti, Ta, W, Ru, Co, Ni, a combination thereof or the like. In some embodiments, a seed layer and/or a barrier layer may be disposed between each metal pad and the polymer layer PM. The seed layer may include Ti/Cu. The barrier layer may include Ta, TaN, Ti, TiN, CoW or a combination thereof.

Referring to FIG. 1, under bump metallization pads UBM are further included in the integrated circuit package 1. The under bump metallization pads UBM are disposed over and electrically connected to the redistribution layer structure RDL. The under bump metallization pads UBM may include Cu, Ti, Ta, W, Ru, Co, Ni, a combination thereof or the like. In some embodiments, a seed layer and/or a barrier layer may be disposed between each under bump metallization pad and the polymer layer. The seed layer may include Ti/Cu. The barrier layer may include Ta, TaN, Ti, TiN, CoW or a combination thereof.

In some embodiments, bumps B are further included in the integrated circuit package 1. The bumps B are disposed over and electrically connected to the under bump metallization pads UBM and therefore the redistribution layer structure RDL. In some embodiments, the bumps B include copper, solder, nickel or a combination thereof. In some embodiments, the bumps B may be solder balls, controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like.

In some embodiments, as shown in FIG. 1, a dielectric encapsulation E is further included in the integrated circuit package 1. The dielectric encapsulation E is formed around the first die stack 100, the second die stack 200 and the dummy die 300. Specifically, the dielectric encapsulation E fills the gap between any two of the first die stack 100, the second die stack 200 and the dummy die 300. In some embodiments, the dielectric encapsulation E includes a molding compound, a molding underfill, a resin or the like. In some embodiments, the dielectric encapsulation E includes a polymer material such as polybenzoxazole (PBO), polyimide, benzocyclobutene (BCB), a combination thereof, or the like. In alternative embodiments, the dielectric encapsulation E includes silicon oxide, silicon nitride or a combination thereof. In some embodiments, the gap between any two of the first die stack 100, the second die stack 200 and the dummy die 300 ranges from 10 µm to 70 µm.

The above embodiments in which the gap between any two of the first die stack 100, the second die stack 200 and the dummy die 300 is filled with the dielectric encapsulation E are provided for illustration purposes, and are not construed as limiting the present disclosure. In alternative embodiments, the gap between any two of the first die stack 100, the second die stack 200 and the dummy die 300 may be filled with air A, as shown in FIG. 1. The air may be dry air. The air may be replaced by a dry inert gas such as argon, a dry inactive gas such as nitrogen or any suitable gas.

FIG. 2A to FIG. 2E are simplified cross-sectional views of a method of forming an integrated circuit package in accordance with some embodiments. For simplicity and clarity of illustration, only few elements are shown in the cross-sectional views of FIG. 2A to FIG. 2E. It is understood that the disclosure is not limited by the method described below. Additional operations can be provided before, during, and/or after the method and some of the operations described below can be replaced or eliminated, for additional embodiments of the methods.

Figure 2A:
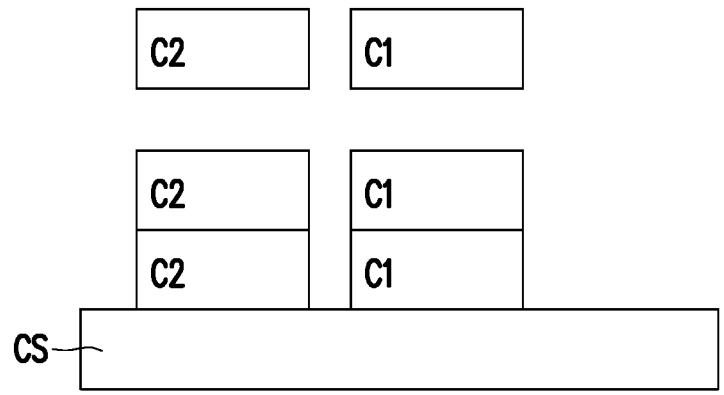
FIG. 2A to FIG. 2E are simplified cross-sectional views of a method of forming an integrated circuit package in accordance with some embodiments.
Figure 2B:
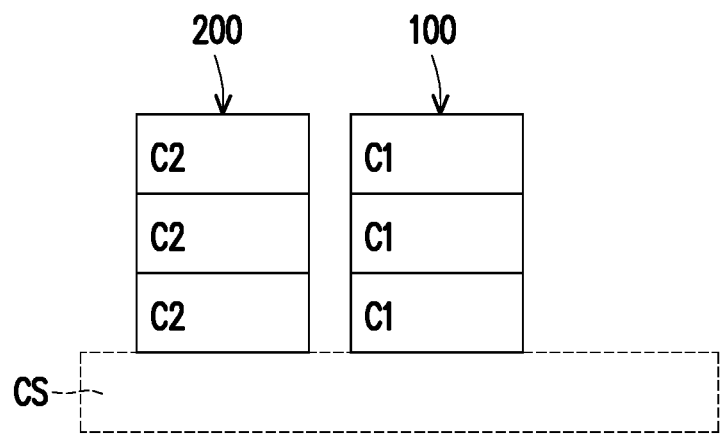

Referring to FIG. 2A to FIG. 2B, a plurality of first die structures C1 is stacked to form a first die stack 100 or a first cube. Specifically, the first die structures C1 are stacked one by one on a carrier substrate CS. The carrier substrate CS may be a glass carrier. In some embodiments, during the operation of stacking the first die structures C1, a plurality of second die structures C2 is stacked to form a second die stack 200 or a second cube. Specifically, the second die structures C2 are stacked one by one on the carrier substrate CS. Thereafter, the carrier substrate CS is removed, as shown in FIG. 2B.

Figure 2C:
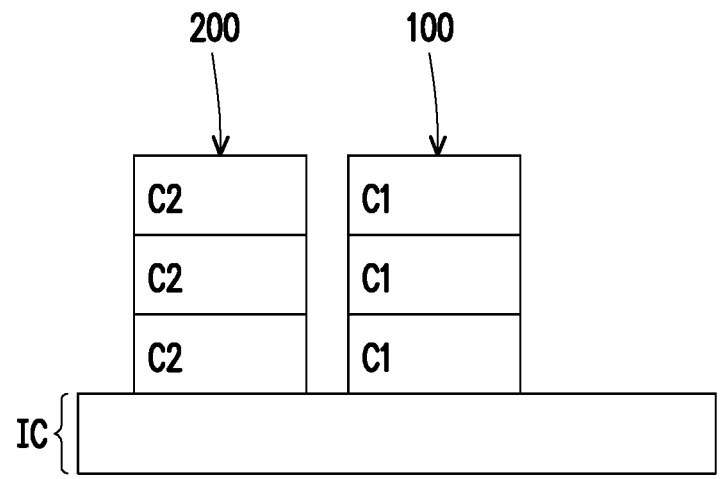

Referring to FIG. 2C, the first die stack 100 is stacked on an integrated circuit structure IC or a base structure. In some embodiments, during the operation of stacking the first die stack 100 on the integrated circuit structure IC, the second die stack 200 is stacked on the integrated circuit structure IC. In some embodiments, the integrated circuit structure IC is referred to as a tier 1 structure, the first die structure C1 and the second die structure C2 that are closest to the integrated circuit structure IC is referred to as a tier 2 structure, the first die structure C1 and the second die structure C2 that are over the tier 2 structure is referred to as a tier 3 structure, and so on.

Figure 2D:
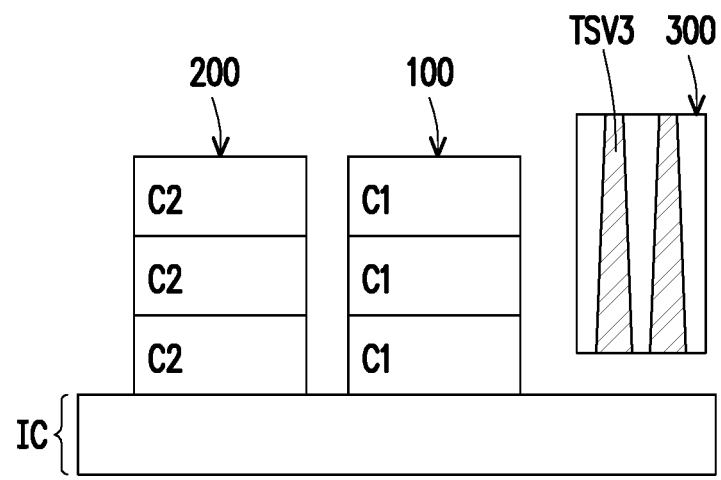

Referring to FIG. 2D, a dummy die 300 having a plurality of through substrate vias TSV3 is stacked on the integrated circuit structure IC aside the first and second die stacks 100 and 200.

Figure 2E:
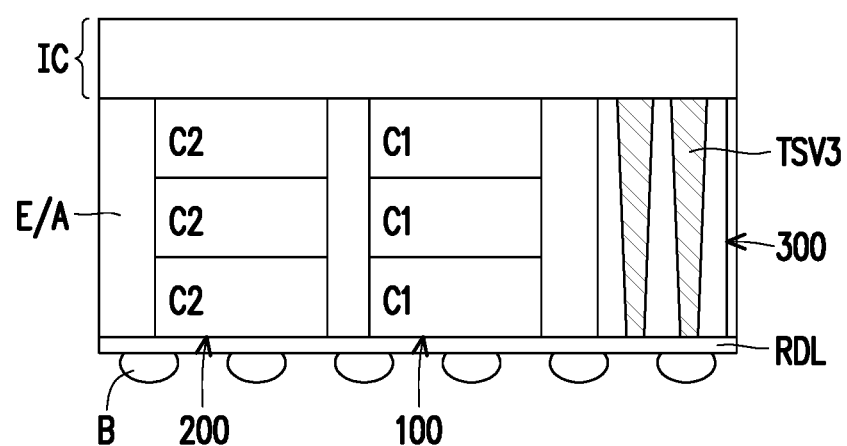

Referring to FIG. 2E, the integrated circuit structure IC having the first die stack 100, the second die stack 200 and the dummy die 300 thereon is turned upside down. Thereafter, a redistribution layer structure RDL is formed on the first die stack 100, the second die stack 200 and the dummy die 300. Afterwards, bumps B are formed over the redistribution layer structure RDL.

In the disclosure, a single and bulk dummy die having through silicon vias is provided to replace the conventional tier-by-tier through dielectric vias. The dummy die of the disclosure is beneficial to simplify the process, reduce the CTE mismatch and improve the warpage profile of the resulting package.

Figure 3:
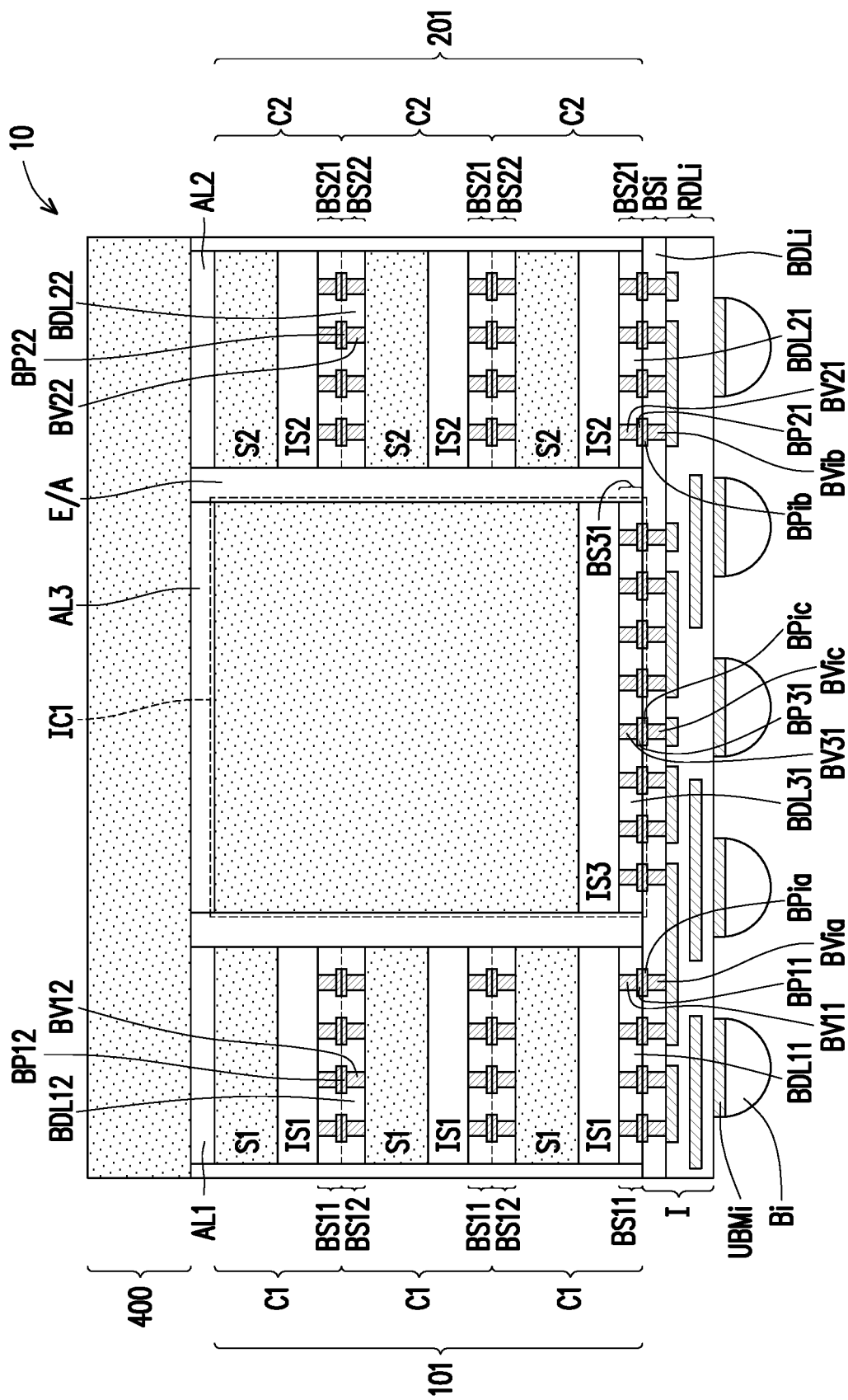
FIG. 3 to FIG. 8 are cross-sectional views of various integrated circuit packages in accordance with alternative embodiments.

FIG. 3 is a cross-sectional view of an integrated circuit package in accordance with alternative embodiments. It is understood that the disclosure is not limited by the structure described below. Additional features can be added in the structure and some of the features described below can be replaced or eliminated, for additional embodiments of the structure.

Referring to FIG. 3, an integrated circuit package 10 includes an interposer structure I, a first die stack 101, a second die stack 201, and an optional integrated circuit structure IC1.

Various embodiments include one or more die stacks bonded to an interposer structure. The interposer structure provides electrical routing between the die stacks. The interposer structure may include a redistribution layer structure disposed on a semiconductor substrate. The redistribution layer structure provides electrical routing to/from one or more die structures in the die stacks. In some embodiments, through substrate vias may extend through the semiconductor substrate and are electrically connected to the conductive features of the redistribution layer structure. In some embodiments, bumps are disposed on the redistribution layer structure to provide electrical connectors for bonding to various components. In some embodiments, in order to achieve a small package profile, the semiconductor substrate of the interposer structure may be thinned or removed during manufacturing, and thus, a silicon-substrate-free (Si-less) or silicon-free interposer structure is provided. In alternative embodiments, the semiconductor substrate of the interposer structure may remain during manufacturing.

In some embodiments, the interposer structure I includes a redistribution layer structure RDLi and a blanket bonding structure BSi. In some embodiments, the interposer structure I is a silicon-free interposer structure.

The redistribution layer structure RDLi includes at least one polymer layer and conductive features embedded by the polymer layer. The conductive features include metal pads, metal lines and/or metal vias configured to electrically connect to different components. In some embodiments, the polymer layer may include a photo-sensitive material such as polybenzoxazole (PBO), polyimide (PI), benzocyclobutene (BCB), a combination thereof or the like. The polymer layer of the redistribution layer structure RDLi may be replaced by a dielectric layer or an insulating layer as needed. In some embodiments, the conductive features may include Cu, Ti, Ta, W, Ru, Co, Ni, a combination thereof or the like. In some embodiments, a seed layer and/or a barrier layer may be disposed between each metal feature and the polymer layer. The seed layer may include Ti/Cu. The barrier layer may include Ta, TaN, Ti, TiN, CoW or a combination thereof.

The blanket bonding structure BSi may be disposed over and electrically connected to a first side of the redistribution layer structure RDLi. In some embodiments, the blanket bonding structure BSi includes at least one bonding dielectric layer and bonding metal features embedded in the bonding dielectric layer. In some embodiments, the bonding dielectric layer includes silicon oxide, silicon nitride, a polymer or a combination thereof. In some embodiments, the bonding metal features include bonding pads BPia, BPib and BPic and bonding vias BVia, BVib and BVic. Specifically, as shown in FIG. 3, the bonding pad BPia and the bonding via BVia are electrically connected to the first die stack 101, the bonding pad BPib and the bonding via BVib are electrically connected the second die stack 201, and the bonding pad BPic and the bonding via BVic are electrically connected to the integrated circuit structure IC1. The bonding metal features may include Cu, Ti, Ta, W, Ru, Co, Ni, a combination thereof or the like. In some embodiments, a seed layer and/or a barrier layer may be disposed between each bonding metal feature and the bonding dielectric layer BDLi. The seed layer may include Ti/Cu. The barrier layer may include Ta, TaN, Ti, TiN, CoW or a combination thereof.

Referring to FIG. 3, under bump metallization pads UBMi are further included in the interposer structure I. The under bump metallization pads UBMi are disposed over and electrically connected to a second side of the redistribution layer structure RDLi. The second side is opposite to the first side of the redistribution layer structure RDLi. The under bump metallization pads UBMi may include Cu, Ti, Ta, W, Ru, Co, Ni, a combination thereof or the like. In some embodiments, a seed layer and/or a barrier layer may be disposed between each under bump metallization pad and the polymer layer. The seed layer may include Ti/Cu. The barrier layer may include Ta, TaN, Ti, TiN, CoW or a combination thereof.

In some embodiments, bumps Bi are further included in the interposer structure I. The bumps Bi are disposed over and electrically connected to the under bump metallization pads UBM and therefore the redistribution layer structure RDLi. In some embodiments, the bumps Bi include copper, solder, nickel or a combination thereof. In some embodiments, the bumps Bi may be solder balls, controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like.

Referring to FIG. 3, the first die stack 101 is bonded to the interposer structure I. In some embodiments, the first die stack 100 includes a plurality of first die structures C1 vertically stacked. Each of the first die structures C1 may include one or more functional devices such as active components and/or passive components. In some embodiments, each of the first die structures C1 may include a logic die, a memory die, a CPU, a GPU, an xPU, a MEMS die, a SoC die, or the like. The first die structure C1 in FIG. 3 may be similar to the first die structure C1 in FIG. 1, and the material and configuration thereof may refer to those of the first die structure C1 in FIG. 1. In some embodiments, each of the first die structures C1 includes a semiconductor substrate S1, an interconnect structure IS1 and at least one bonding structure.

The semiconductor substrate S1 in FIG. 3 may be similar to the semiconductor substrate S1 in FIG. 1, so the material and configuration thereof may refer to those of the semiconductor substrate S1 in FIG. 1. In some embodiments, the semiconductor substrate S1 includes isolation structures defining at least one active area, and at least one device is disposed on/in the active area. In some embodiments, the semiconductor substrate S1 may have one or more through substrate vias such as through silicon vias. In some embodiments, the top portion of the through substrate via extends into the interconnect structure IS1, and the bottom portion of the through substrate via is surrounded by an insulating layer.

The interconnect structure IS1 in FIG. 3 may be similar to the interconnect structure IS1 in FIG. 1, so the material and configuration thereof may refer to those of the interconnect structure IS1 in FIG. 1. In some embodiments, the interconnect structure IS1 may be disposed over a first side (e.g., front side) of the semiconductor substrate S1. Specifically, the interconnect structure IS1 is disposed over and electrically connected to the device. In some embodiments, the interconnect structure IS1 includes inter-metal dielectric layers and metal features embedded in the inter-metal dielectric layers.

The bonding structure BS11 in FIG. 3 may be similar to the bonding structure BS11 in FIG. 1, so the material and configuration thereof may refer to those of the bonding structure BS11 in FIG. 1. In some embodiments, the bonding structure BS11 may be disposed over the first side (e.g., front side) of the semiconductor substrate S1. Specifically, the bonding structure BS11 may be disposed over and electrically connected to the interconnect structure IS1. In some embodiments, the bonding structure BS11 includes at least one bonding dielectric layer BDL11 and at least one bonding metal feature embedded in the bonding dielectric layer BDL11. In some embodiments, the at least one bonding metal feature includes a bonding pad BP11 and a bonding via BV11. Specifically, as shown in FIG. 3, the bonding pad BP11 and the bonding via BV11 of one first die structure C1 are electrically connected to the bonding structure BSi of the interposer structure I or the bonding structure BS12 of another first die structure C1.

In some embodiments, the first die structure C1 may optionally include a bonding structure BS12 disposed over the second side (e.g., back side) of the semiconductor substrate S1. In some embodiments, the bonding structure BS12 includes at least one bonding dielectric layer BDL12 and at least one bonding metal feature embedded in the bonding dielectric layer BDL12. In some embodiments, the at least one bonding metal feature includes a bonding pad BP12 and a bonding via BV12. Specifically, as shown in FIG. 3, the bonding pad BP12 and the bonding pad BV12 of one first die structure C1 are electrically connected to the bonding structure BS11 of another first die structure C1.

In some embodiments, the first die stack 101 is bonded to the interposer structure I through a hybrid bonding including a metal-to-metal bonding and a dielectric-to-dielectric bonding. Specifically, the bonding pad BP11 of the first die stack 101 is bonded to the bonding pad BPia of the interposer structure I, and the bonding dielectric layer BDL11 of the first die stack 101 is bonded to the bonding dielectric layer BDLi of the interposer structure I.

In the first die stack 101, the first die structures C1 are stacked in a face-to-back configuration, as shown in FIG. 3.

However, the disclosure is not limited thereto, and another face-to-face configuration and/or back-to-back configuration may be applied. Besides, the embodiments in which the first die stack 101 has three die structures are provided for illustration purposes, and are not construed as limiting the present disclosure. The number of the die structures of the first die stack 101 is not limited by the disclosure.

In some embodiments, the two adjacent first die structures C1 are bonded to each other through a hybrid bonding including a metal-to-metal bonding and a dielectric-to-dielectric bonding. Specifically, the bonding pad BP11 of one first die structure C1 is bonded to the bonding pad BP12 of another first die structure C1, and the bonding dielectric layer BDL11 of one first die structure C1 is bonded to the bonding dielectric layer BDL12 of another first die structure C1.

In some embodiments, the lowermost first die structure C1 of the first die stack 101 close to the interposer structure I has two bonding structures BS11 and BS12 at the front and back sides thereof, and the topmost first die structure C1 of the first die stack 101 away from the interposer structure I has one bonding structure BS11 at the front side thereof. In the first die stack 101, the middle first die structure C between the topmost and lowermost first die structures C1 has two bonding structures BS11 and BS12 at the front and back sides thereof.

Referring to FIG. 3, the second die stack 201 is bonded to the interposer structure I aside the first die stack 101. The second die stack 201 may be similar to the first die stack 101, and the material and configuration thereof may refer to those of the first die stack 101. The second die stack 201 includes a plurality of second die structures C2 vertically stacked. Each of the second die structures C2 may include one or more functional devices such as active components and/or passive components. In some embodiments, each of the second die structures C2 may include a logic die, a memory die, a CPU, a GPU, an xPU, a MEMS die, a SoC die, or the like. The second die structure C2 may be similar to the first die structure C1, and the material and configuration thereof may refer to those of the first die structure C1. In some embodiments, the second die structure C2 includes a semiconductor substrate S2, an interconnect structure IS2 and at least one bonding structure.

The function of the second die stack 201 and/or the second die structure C2 may be the same as that of the first die stack 101 and/or the first die structure C1. For example, both of the first and second die stacks is a memory stack, such as a High Bandwidth Memory (HBM) cube. The first and second die stacks may have different functions as needed. Besides, upon the process requirements, the dimension of the second die stack 201 and/or the second die structure C2 may be similar to or different from the dimension of the first die stack 101 and/or the first die structure C1. The dimension may be a height, a width, a size, a top-view area or a combination thereof.

The semiconductor substrate S2 may be similar to the semiconductor substrate S1, so the material and configuration thereof may refer to those of the semiconductor substrate S. In some embodiments, the semiconductor substrate S2 includes isolation structures defining at least one active area, and at least one device is disposed on/in the active area. In some embodiments, the semiconductor substrate S2 may have one or more through substrate vias such as through silicon vias. In some embodiments, the top portion of the through substrate via extends into the interconnect structure IS2, and the bottom portion of the through substrate via TSV2 is surrounded by an insulating layer.

The interconnect structure IS2 may be similar to the interconnect structure IS1, so the material and configuration thereof may refer to those of the interconnect structure IS1. In some embodiments, the interconnect structure IS2 may be disposed over a first side (e.g., front side) of the semiconductor substrate S2. Specifically, the interconnect structure IS2 is disposed over and electrically connected to the device. In some embodiments, the interconnect structure IS2 includes inter-metal dielectric layers and metal features embedded in the inter-metal dielectric layers.

The bonding structure BS21 may be similar to the bonding structure BS11, so the material and configuration thereof may refer to those of the bonding structure BS11. In some embodiments, the bonding structure BS21 may be disposed over the first side (e.g., front side) of the semiconductor substrate S2. Specifically, the bonding structure BS21 may be disposed over and electrically connected to the interconnect structure IS2. In some embodiments, the bonding structure BS21 includes at least one bonding dielectric layer BDL21 and at least one bonding metal feature embedded in the bonding dielectric layer BDL21. In some embodiments, the at least one bonding metal feature includes a bonding pad BP21 and a bonding via BV21. Specifically, as shown in FIG. 3, the bonding pad BP21 and the bonding via BV21 of one second die structure C2 are electrically connected to the bonding structure BSi of the interposer structure I or the bonding structure BS22 of another second die structure C2.

In some embodiments, the second die structure C2 may optionally include a bonding structure BS22 disposed over the second side (e.g., back side) of the semiconductor substrate S2. In some embodiments, the bonding structure BS22 includes at least one bonding dielectric layer BDL22 and at least one bonding metal feature embedded in the bonding dielectric layer BDL22. In some embodiments, the at least one bonding metal feature includes a bonding pad BP22 and a bonding via BV22. Specifically, as shown in FIG. 3, the bonding pad BP22 and the bonding pad BV22 of one second die structure C2 are electrically connected to the bonding structure BS21 of another second die structure C2.

In some embodiments, the second die stack 201 is bonded to the interposer structure I through a hybrid bonding including a metal-to-metal bonding and a dielectric-to-dielectric bonding. Specifically, the bonding pad BP21 of the second die stack 201 is bonded to the bonding pad BPib of the interposer structure I, and the bonding dielectric layer BDL21 of the second die stack 201 is bonded to the bonding dielectric layer BDLi of the interposer structure I.

In the second die stack 201, the second die structures C2 are stacked in a face-to-back configuration, as shown in FIG. 3. However, the disclosure is not limited thereto, and another face-to-face configuration and/or back-to-back configuration may be applied. Besides, the embodiments in which the second die stack 201 has three die structures are provided for illustration purposes, and are not construed as limiting the present disclosure. The number of the die structures of the second die stack 201 is not limited by the disclosure.

In some embodiments, the two adjacent second die structures C2 are bonded to each other through a hybrid bonding including a metal-to-metal bonding and a dielectric-to-dielectric bonding. Specifically, the bonding pad BP21 of one second die structure C2 is bonded to the bonding pad BP22 of another second die structure C2, and the bonding dielectric layer BDL21 of one second die structure C2 is bonded to the bonding dielectric layer BDL22 of another second die structure C2.

In some embodiments, the lowermost second die structure C2 of the second die stack 201 close to the interposer structure I has two bonding structures BS21 and BS22 at the front and back sides thereof, and the topmost second die structure C2 of the second die stack 200 away from the interposer structure I has one bonding structure BS21 at the front side thereof. In the second die stack 201, the middle second die structure C2 between the topmost and lowermost second die structures C2 has two bonding structures BS21 and BS22 at the front and back sides thereof.

Referring to FIG. 3, an integrated circuit structure IC1 is bonded to the interposer structure I aside the first die stack 101 and the second die stack 201. The integrated circuit structure IC1 may include one or more functional devices such as active components and/or passive components. In some embodiments, the integrated circuit structure IC1 may include a logic die, a memory die, a CPU, a GPU, an xPU, a MEMS die, a SoC die, or the like.

The function of the integrated circuit structure IC1 may be different from that of the first die stack 101 and/or the second die stack 201. For example, both of the first and second die stacks is a memory stack, and the integrated circuit structure IC1 is a logic die. The integrated circuit structure IC1 may have a function the same as that of the first die stack 101 and/or the second die stack 201 as needed. Besides, upon the process requirements, the dimension of the integrated circuit structure IC1 may be similar to or different from the dimension of the first die stack 101 and/or the second die stack 201. The dimension may be a height, a width, a size, a top-view area or a combination thereof.

In some embodiments, the integrated circuit structure IC1 is a single die structure. The integrated circuit structure IC1 in FIG. 3 may be similar to the integrated circuit IC in FIG. 1, and the material and configuration thereof may refer to those of the integrated circuit IC in FIG. 1. In some embodiments, the integrated circuit structure IC1 includes a semiconductor substrate S3, an interconnect structure IS3 and a bonding structure BS31.

The semiconductor substrate S3 and the interconnect structure IS3 in FIG. 3 may be similar to the semiconductor substrate S and the interconnect structure IS in FIG. 1, the materials and configurations thereof may refer to those of the semiconductor substrate S and the interconnect structure IS in FIG. 1.

The bonding structure BS31 may be similar to the bonding structure BS11, so the material and configuration thereof may refer to those of the bonding structure BS11. In some embodiments, the bonding structure BS31 may be disposed over the first side (e.g., front side) of the semiconductor substrate S3. Specifically, the bonding structure BS31 may be disposed over and electrically connected to the interconnect structure IS3. In some embodiments, the bonding structure BS31 includes at least one bonding dielectric layer BDL31 and at least one bonding metal feature embedded in the bonding dielectric layer BDL31. In some embodiments, the at least one bonding metal feature includes a bonding pad BP31 and a bonding via BV31. Specifically, as shown in FIG. 3, the bonding pad BP31 and the bonding via BV31 of the integrated circuit structure IC1 are electrically connected to the bonding structure BSi of the interposer structure I.

In some embodiments, the integrated circuit structure IC1 is bonded to the interposer structure I through a hybrid bonding including a metal-to-metal bonding and a dielectric-to-dielectric bonding. Specifically, the bonding pad BP31 of the integrated circuit structure IC1 is bonded to the bonding pad BPic of the interposer structure I, and the bonding dielectric layer BDL31 of the integrated circuit structure IC1 is bonded to the bonding dielectric layer BDLi of interposer structure I.

Referring to FIG. 3, a cover member 400 is further included in the integrated circuit package 10. The cover member 400 is disposed over the first die stack 101, the second die stack 201 and the integrated circuit structure IC1. In some embodiments, the cover member 400 may be a substrate including a semiconductor material, an inorganic material, an insulating material or a combination thereof, For example, the cover member 400 includes silicon, ceramic, quartz or the like. In some embodiments, the cover member 400 is a device-free member, but the disclosure is not limited thereto. In alternative embodiments, the cover member 400 may be a device-containing member.

In some embodiments, an adhesion layer AL1 is further provided between the cover member 400 and the first die stack 101, an adhesion layer AL2 is further provided between the cover member 400 and the second die stack 201, and an adhesion layer AL3 is further provided between the cover member 400 and the integrated circuit structure IC1. The adhesion layers AL1, AL2 and AL3 may include an oxide layer, a die attach tape (DAF) or a suitable adhesive.

Referring to FIG. 3, a dielectric encapsulation E is further included in the integrated circuit package 10. The dielectric encapsulation E is formed around the first die stack 101, the second die stack 201 and the integrated circuit structure IC1. Specifically, the dielectric encapsulation E fills the gap between any two of the first die stack 101, the second die stack 201 and the integrated circuit structure IC1. In some embodiments, the dielectric encapsulation E includes a molding compound, a molding underfill, a resin or the like. In some embodiments, the dielectric encapsulation E includes a polymer material such as polybenzoxazole (PBO), polyimide, benzocyclobutene (BCB), a combination thereof, or the like. In alternative embodiments, the dielectric encapsulation E includes silicon oxide, silicon nitride or a combination thereof. In some embodiments, the gap between any two of the first die stack 101, the second die stack 201 and the integrated circuit structure IC1 ranges from 10 μm to 70 μm.

The above embodiments in which the gap between any two of the first die stack 101, the second die stack 201 and the integrated circuit structure IC1 is filled with the dielectric encapsulation E are provided for illustration purposes, and are not construed as limiting the present disclosure. In alternative embodiments, the gap between any two of the first die stack 101, the second die stack 201 and the integrated circuit structure IC1 may be filled with air A, as shown in FIG. 3. The air may be dry air. The air may be replaced by a dry inert gas such as argon, a dry inactive gas such as nitrogen or any suitable gas.

The integrated circuit packages 11-15 of FIGS. 4-8 are modified structures of the integrated package 10 of FIG. 3, so the difference between them is illustrated in the following, and the similarity is not iterated herein.

Figure 4:
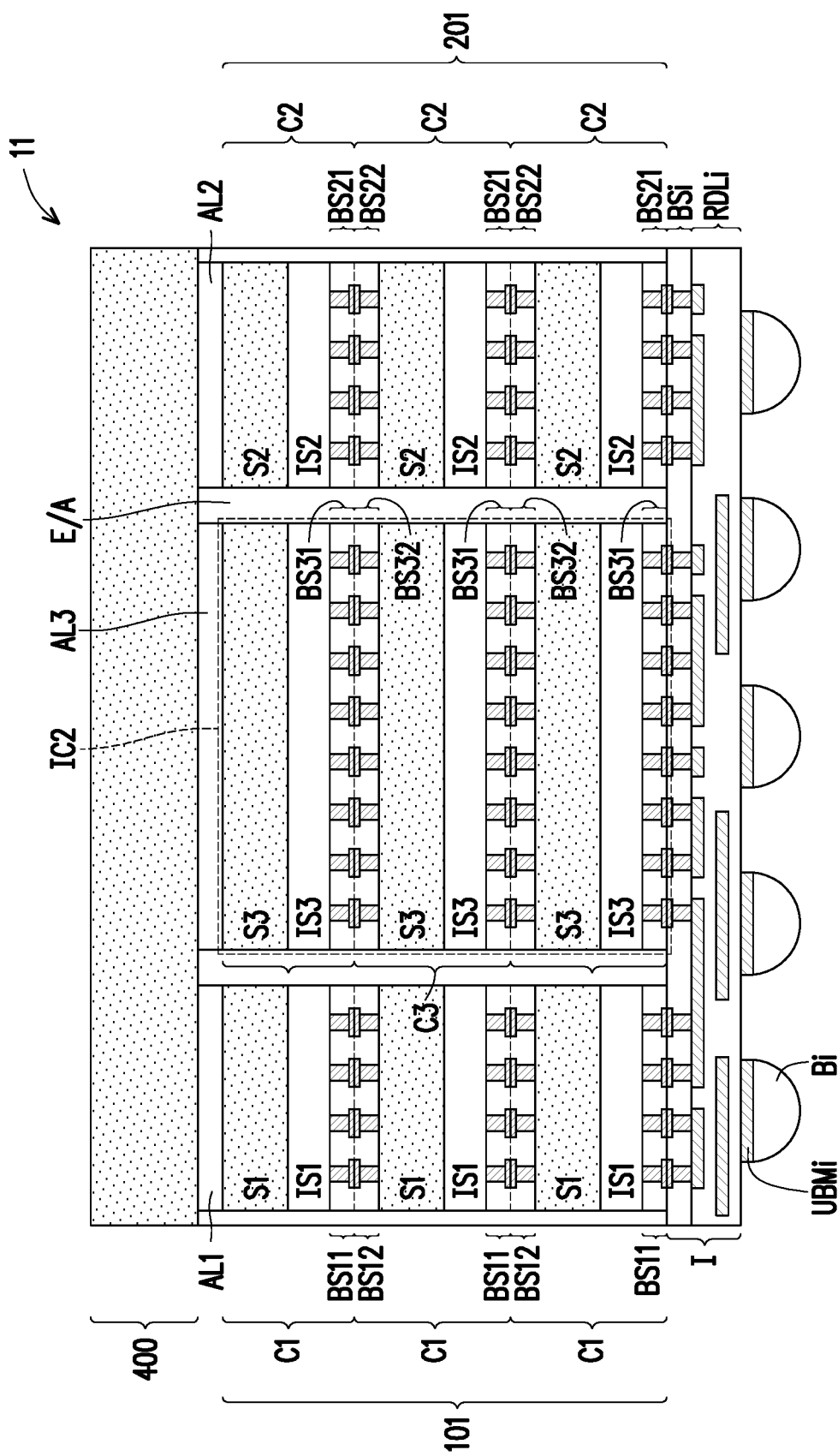

The integrated circuit package 11 of FIG. 4 may be similar to the integrated circuit package 10 of FIG. 3, and the difference between them lies in that, the integrated circuit structure IC1 in FIG. 3 is a single die structure, while the integrated circuit structure IC2 in FIG. 4 is a third die stack including a plurality of third die structures C3. In some embodiments, each of the third die structures C3 includes a semiconductor substrate S3, an interconnect structure IS3, a bonding structure BS31 and an optional bonding structure BS32.

In the integrated circuit structure IC2, the third die structures C3 are stacked in a face-to-back configuration, as shown in FIG. 4. However, the disclosure is not limited thereto, and another face-to-face configuration and/or backto-back configuration may be applied. Besides, the embodiments in which the integrated circuit structure IC2 has three die structures are provided for illustration purposes, and are not construed as limiting the present disclosure. The number of the die structures of the integrated circuit structure IC2 is not limited by the disclosure.

In some embodiments, the two adjacent third die structures C3 are bonded to each other through a hybrid bonding including a metal-to-metal bonding and a dielectric-to-dielectric bonding. Specifically, the bonding pad of one third die structure C3 is bonded to another bonding pad of another third die structure C3, and the bonding dielectric layer of one third die structure C3 is bonded to another bonding dielectric layer of another third die structure C3.

Figure 5:
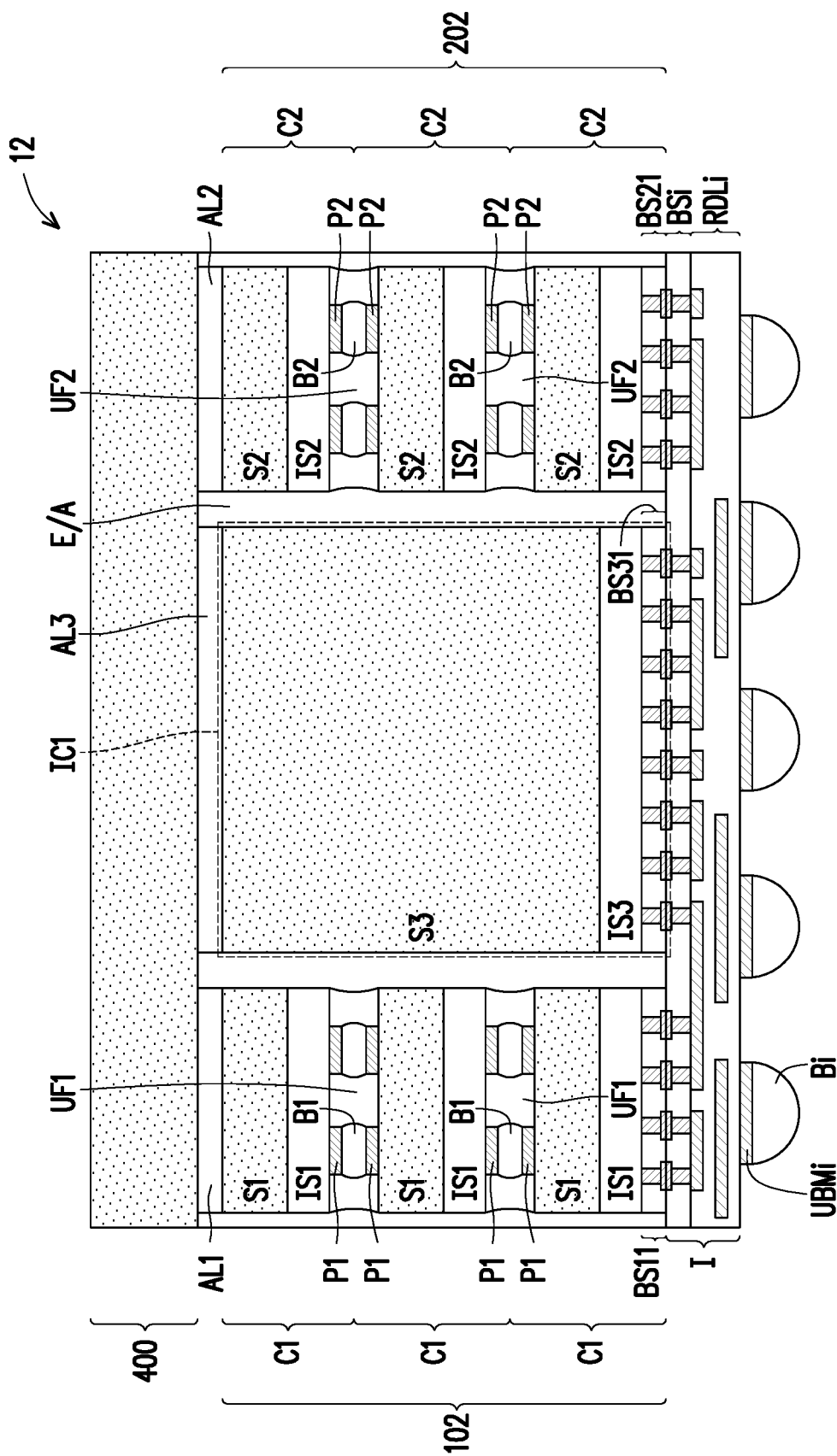

The integrated circuit package 12 of FIG. 5 may be similar to the integrated circuit package 10 of FIG. 3, and the difference between them lies in that, the first/second die structures C1/C2 in the first/second die stack 101/201 in FIG. 3 are bonded through a hybrid bonding, while the first/second die structures C1/C2 in the first/second die stack 102/202 in FIG. 5 are bonded through a solder joint.

In some embodiments, each of the first die structures C1 includes a semiconductor substrate S1, an interconnect structure IS1, bonding pad P1 and bumps B1, and an optional bonding structures BS11. The bonding pad P1 may be under bump metallization pads. The bumps B1 are disposed over and electrically connected to the pads P1 and therefore the interconnect structure IS1. In some embodiments, the bumps B1 include copper, solder, nickel or a combination thereof. In some embodiments, the bumps B1 may be solder balls, micro-bumps controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like. In some embodiments, the dimension of the bumps B1 is smaller than the dimension of the bumps Bi. For example, the dimension of the bumps Bi is about 5 to 15 times the dimension of the bumps B1.

In some embodiments, the lowermost first die structure C1 of the first die stack 102 close to the interposer structure I has a bonding structure BS11 at the front side thereof and solder bumps B1 at the back side thereof, and the topmost first die structure C1 of the first die stack 102 away from the interposer structure I has solder bumps B1 at the front side thereof. In the first die stack 102, the middle first die structure C1 between the topmost and lowermost first die structures C1 has solder bumps B1 at the front and back sides thereof.

In some embodiments, an underfill layer UF1 is further included in the first die stack 102. The underfill layer UF1 is formed to surround the bumps B1 and fills the space between the two adjacent first die structures C1. In some embodiments, the underfill layer UF1 includes a molding compound such as epoxy.

In some embodiments, each of the second die structures C2 includes a semiconductor substrate S2, an interconnect structure IS2, bonding pad P2 and bumps B2, and an optional bonding structures BS21. The bonding pad P2 may be under bump metallization pads. The bumps B2 are disposed over and electrically connected to the pads P2 and therefore the interconnect structure IS2. In some embodiments, the bumps B2 include copper, solder, nickel or a combination thereof. In some embodiments, the bumps B2 may be solder balls, micro-bumps controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like. In some embodiments, the dimension of the bumps B2 is smaller than the dimension of the bumps Bi. For example, the dimension of the bumps Bi is about 5 to 15 times the dimension of the bumps B2.

In some embodiments, the lowermost second die structure C2 of the second die stack 202 close to the interposer structure I has a bonding structure BS21 at the front side thereof and solder bumps B2 at the back side thereof, and the topmost second die structure C2 of the second die stack 202 away from the interposer structure I has solder bumps B2 at the front side thereof. In the second die stack 202, the middle second die structure C2 between the topmost and lowermost second die structures C2 has solder bumps B2 at the front and back sides thereof.

In some embodiments, an underfill layer UF2 is further included in the second die stack 202. The underfill layer UF2 is formed to surround the bumps B2 and fills the space between the two adjacent second die structures C2. In some embodiments, the underfill layer UF2 includes a molding compound such as epoxy.

Figure 6:
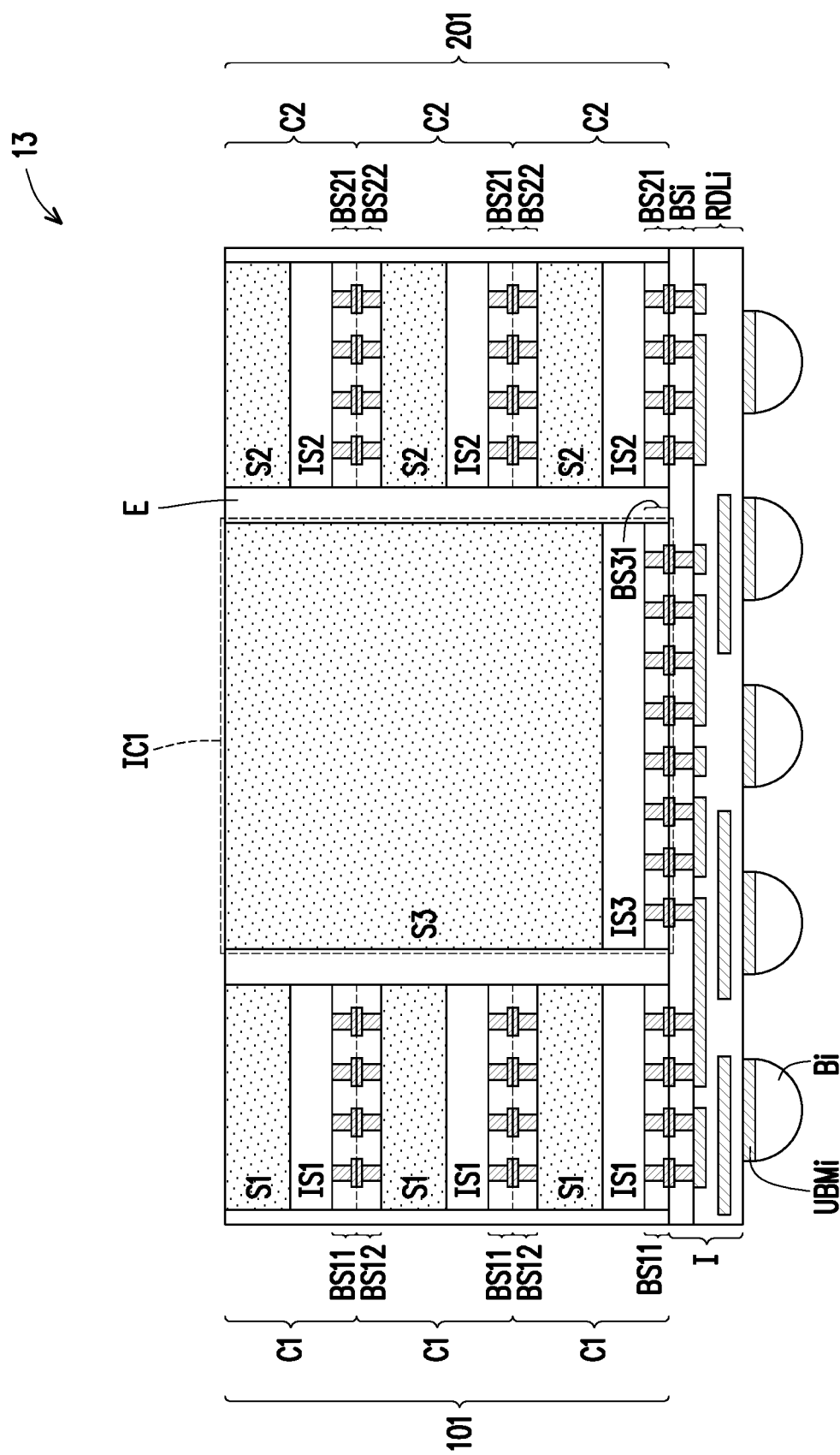
Figure 7:
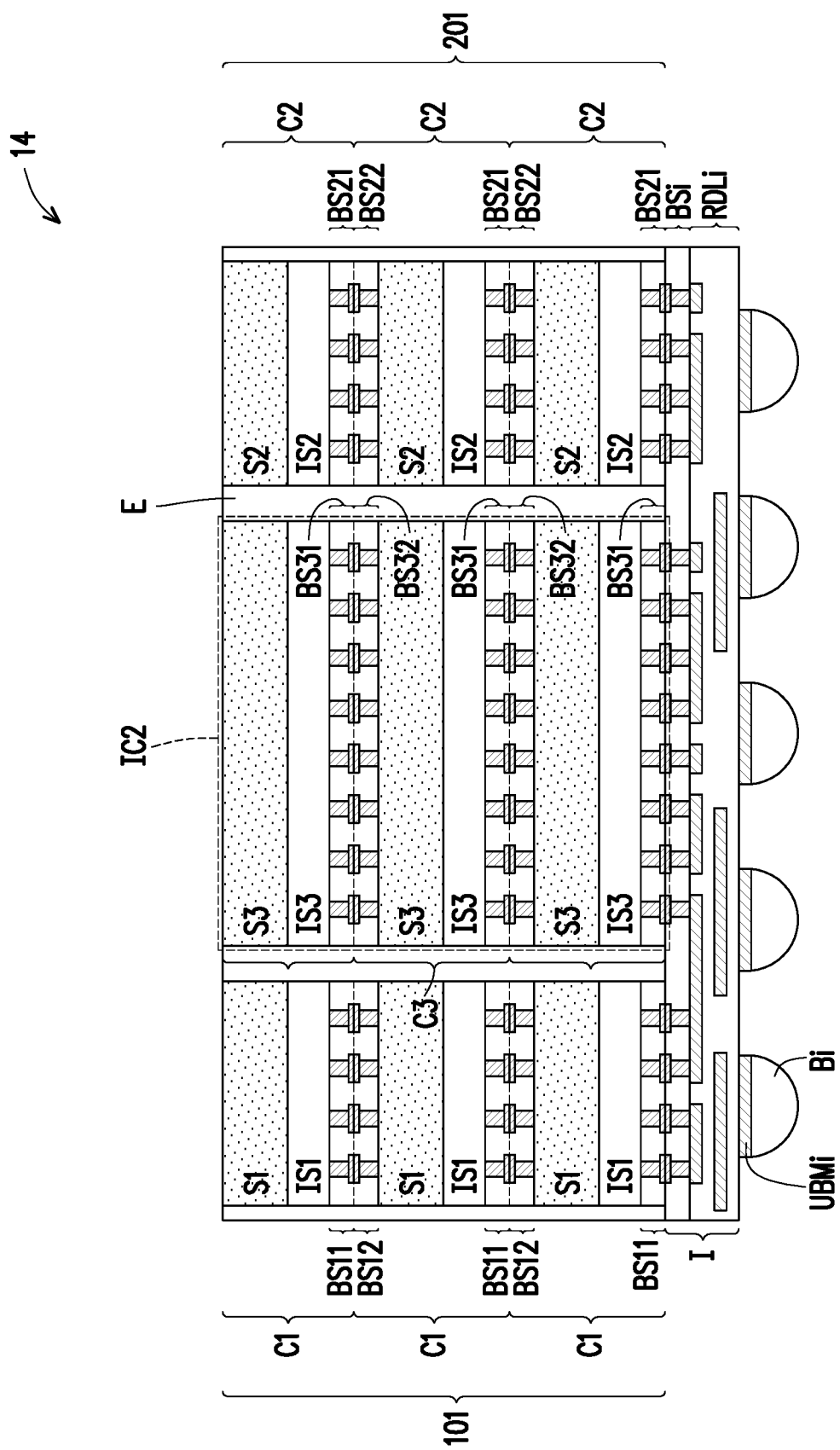
Figure 8:
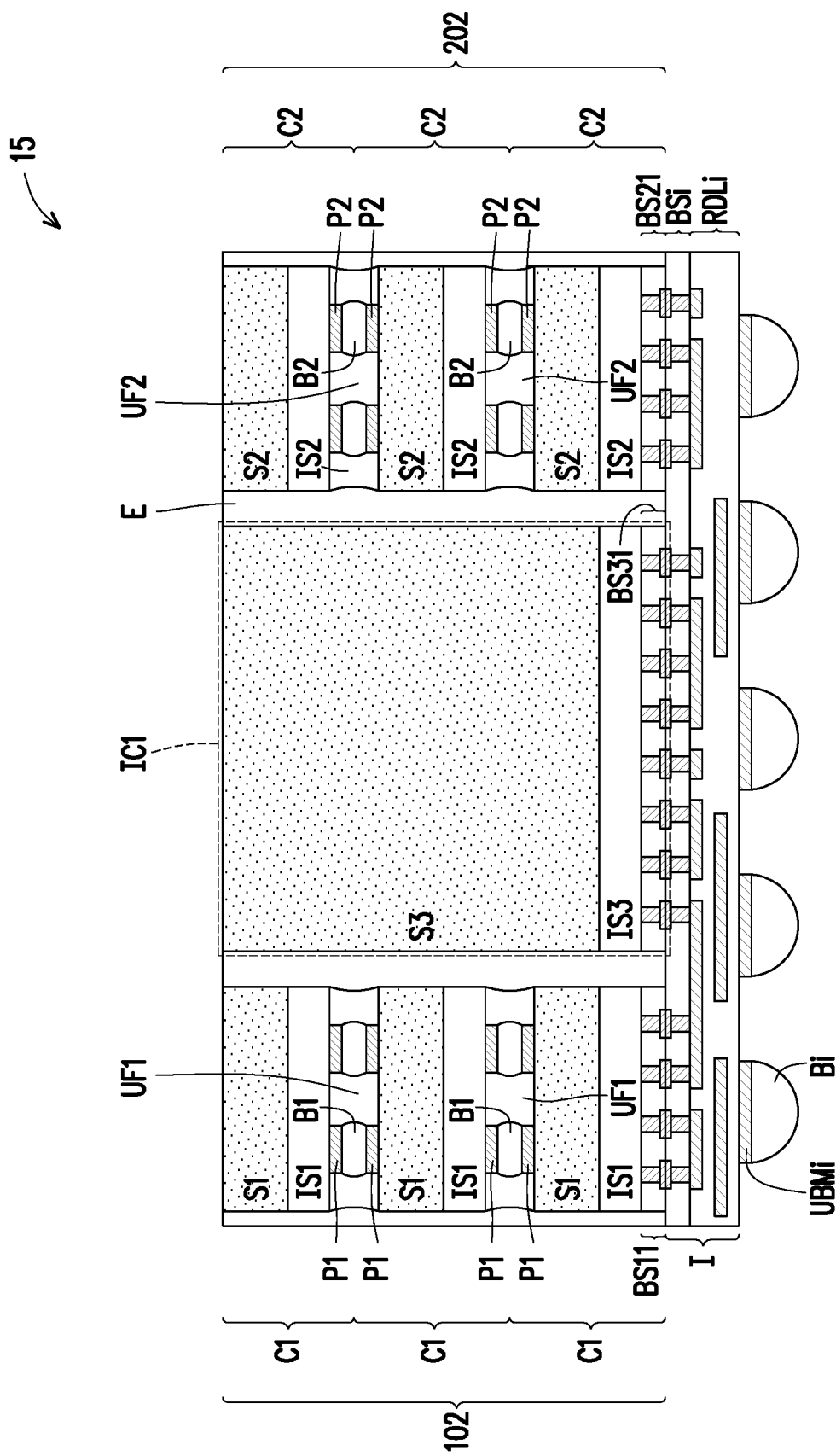

The integrated circuit packages 13-15 of FIGS. 6-8 may be similar to the integrated circuit packages 10-12 of FIGS. 3-5, and the difference between them lies in that, each of the integrated circuit packages 10-12 of FIGS. 3-5 is provided with a cover member 400, while each of the integrated circuit packages 13-15 of FIGS. 6-8 is provided without a cover member 400. In each of the integrated circuit packages 13-15 of FIGS. 6-8, the gap between any two of the first die stack 101/202, the second die stack 201/202 and the integrated circuit structure IC1/IC2 is filled with a dielectric encapsulation E, so as to effectively protect the package from being damaged.

FIG. 9A to FIG. 9D are simplified cross-sectional views of a method of forming an integrated circuit package in accordance with alternative embodiments. For simplicity and clarity of illustration, only few elements are shown in the cross-sectional views of FIG. 9A to FIG. 9D. It is understood that the disclosure is not limited by the method described below. Additional operations can be provided before, during, and/or after the method and some of the operations described below can be replaced or eliminated, for additional embodiments of the methods.

Figure 9A:
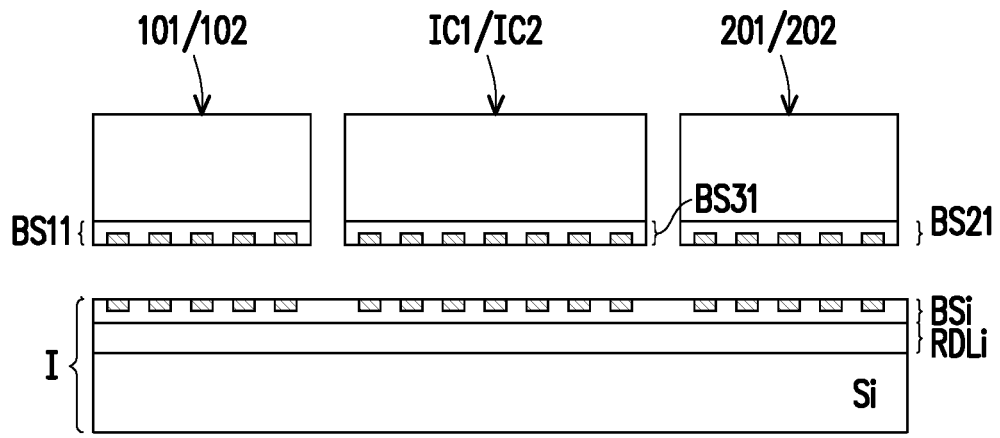
FIG. 9A to FIG. 9D are simplified cross-sectional views of a method of forming an integrated circuit package in accordance with alternative embodiments.

Referring to FIG. 9A, an interposer structure I is provided. In some embodiments, the interposer structure I includes a semiconductor substrate Si, a redistribution layer structure RDLi over the semiconductor substrate Si, and a blanket bonding structure BSi over the redistribution layer structure RDLi.

Thereafter, a first die stack 101/102 having a bonding structure B11, a second die stack 201/202 having a bonding structure BS 21 and an integrated circuit structure IC1/IC2 having a bonding structure BS31 are provided over the interposer structure I. In some embodiments, the operations similar to those in FIGS. 2A-2B may be performed first, so as to form the first die stack 101/102 and the second die stack 201/202. Specifically, first die structures C1 are stacked one by one on a carrier substrate to form the first die stack 101/102, second die structures C2 are stacked one by one on the carrier substrate to form the second die stack 201/202, and the carrier substrate is removed. In some embodiments, when the integrated circuit structure IC1/IC2 is provided as a die stack, the integrated circuit structure IC1/IC2 may be formed during the operations of stacking the first die structures C1 and the second die structures C2.

Figure 9B:
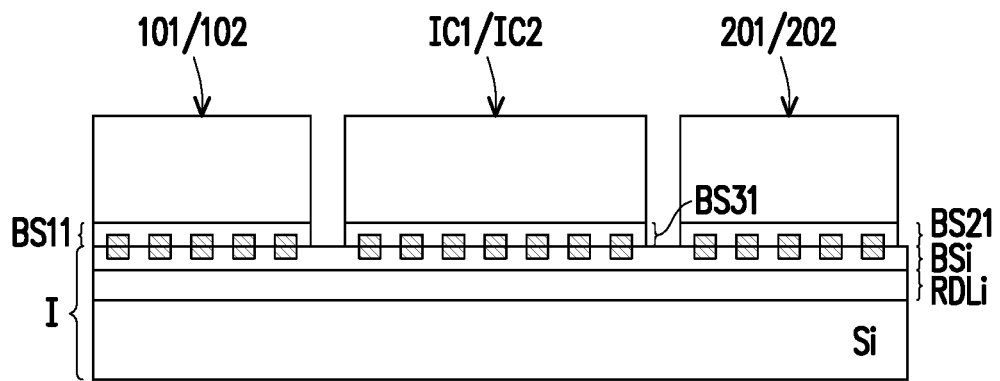

Referring to FIG. 9B, the first die stack 101/102, the second die stack 201/202 and the integrated circuit structure IC1/IC2 are bonded to the interposer structure I through a hybrid bonding comprising a metal-to-metal bonding and a dielectric-to-dielectric bonding. In some embodiments, the respective bonding structures BS11, BS21 and BS31 of the first die stack 101/201, the second die stack 201/202 and the integrated circuit structure IC1/IC2 are bonded to the blanket bonding structure BSi of the interposer structure I.

Figure 9C:
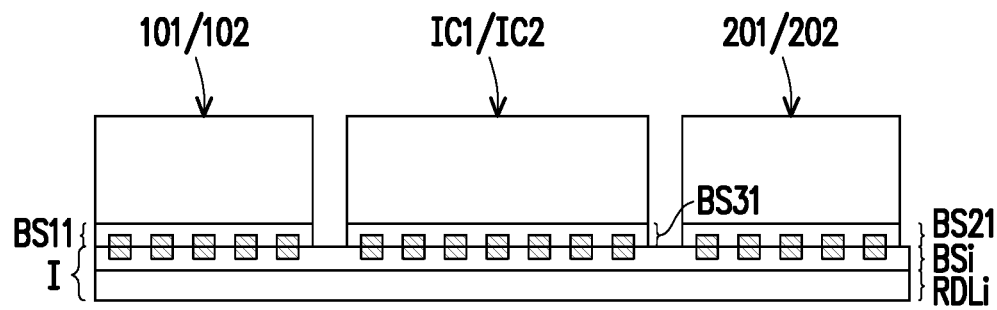

Referring to FIG. 9C, a silicon portion of the interposer structure I is removed. In some embodiments, the semiconductor substrate Si of the interposer structure I is completely removed.

Figure 9D:
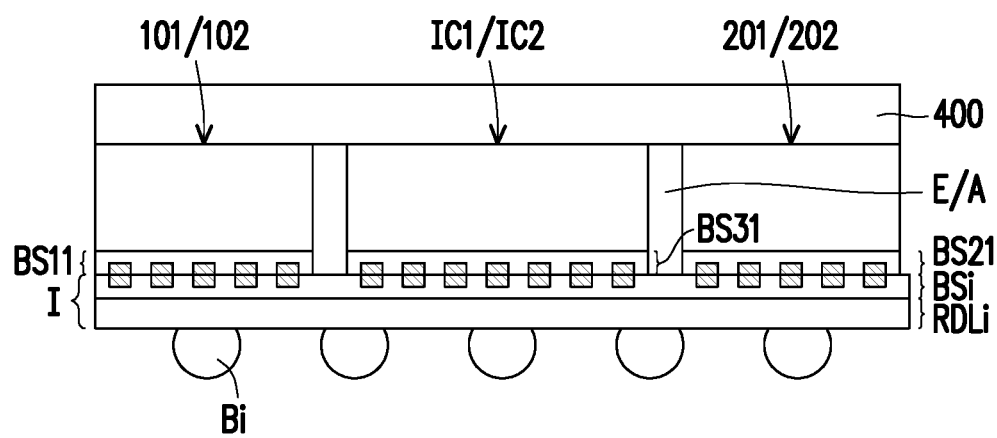
Figure 10:
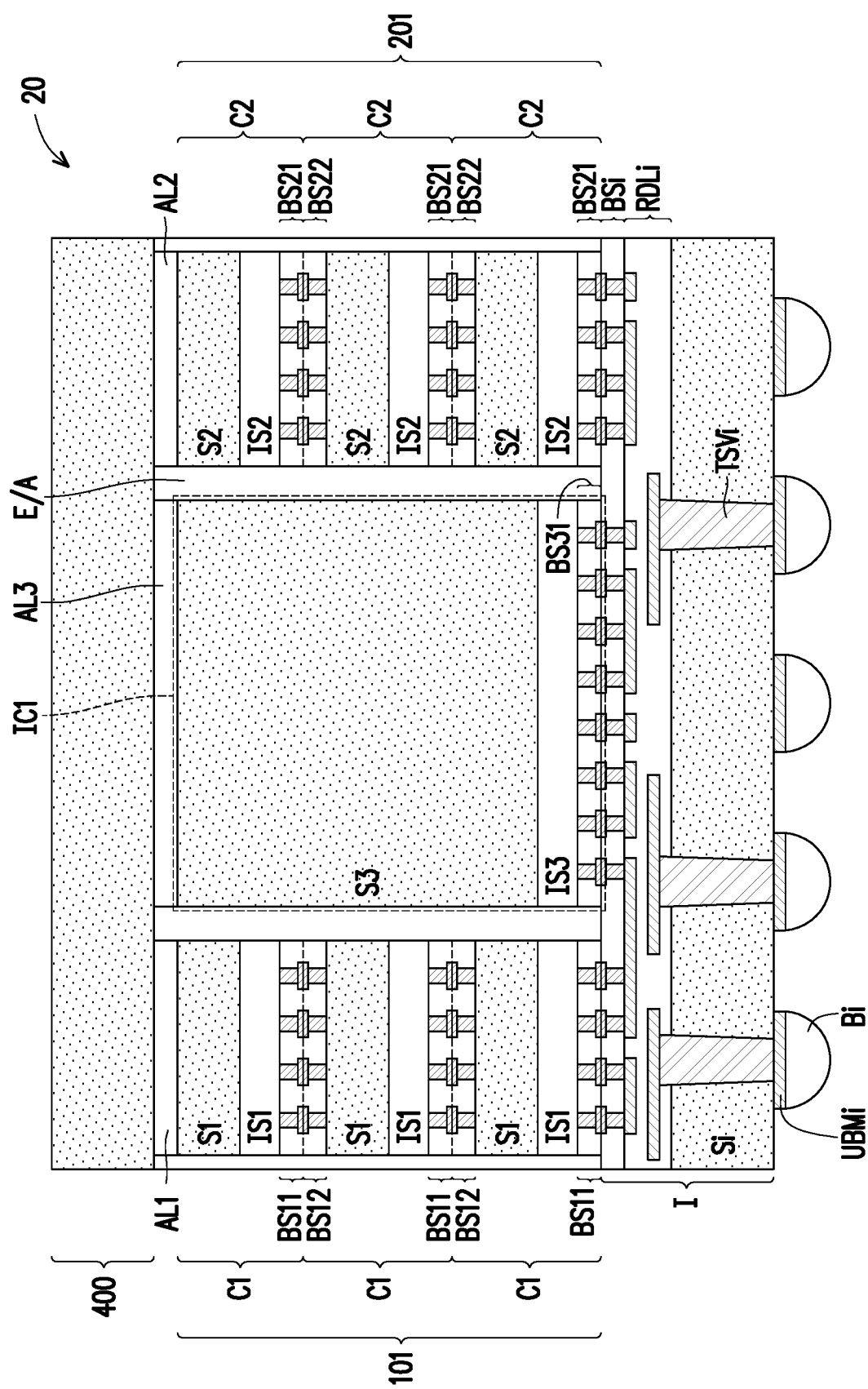
FIG. 10 to FIG. 15 are cross-sectional views of various integrated circuit packages in accordance with yet alternative embodiments.
Figure 11:
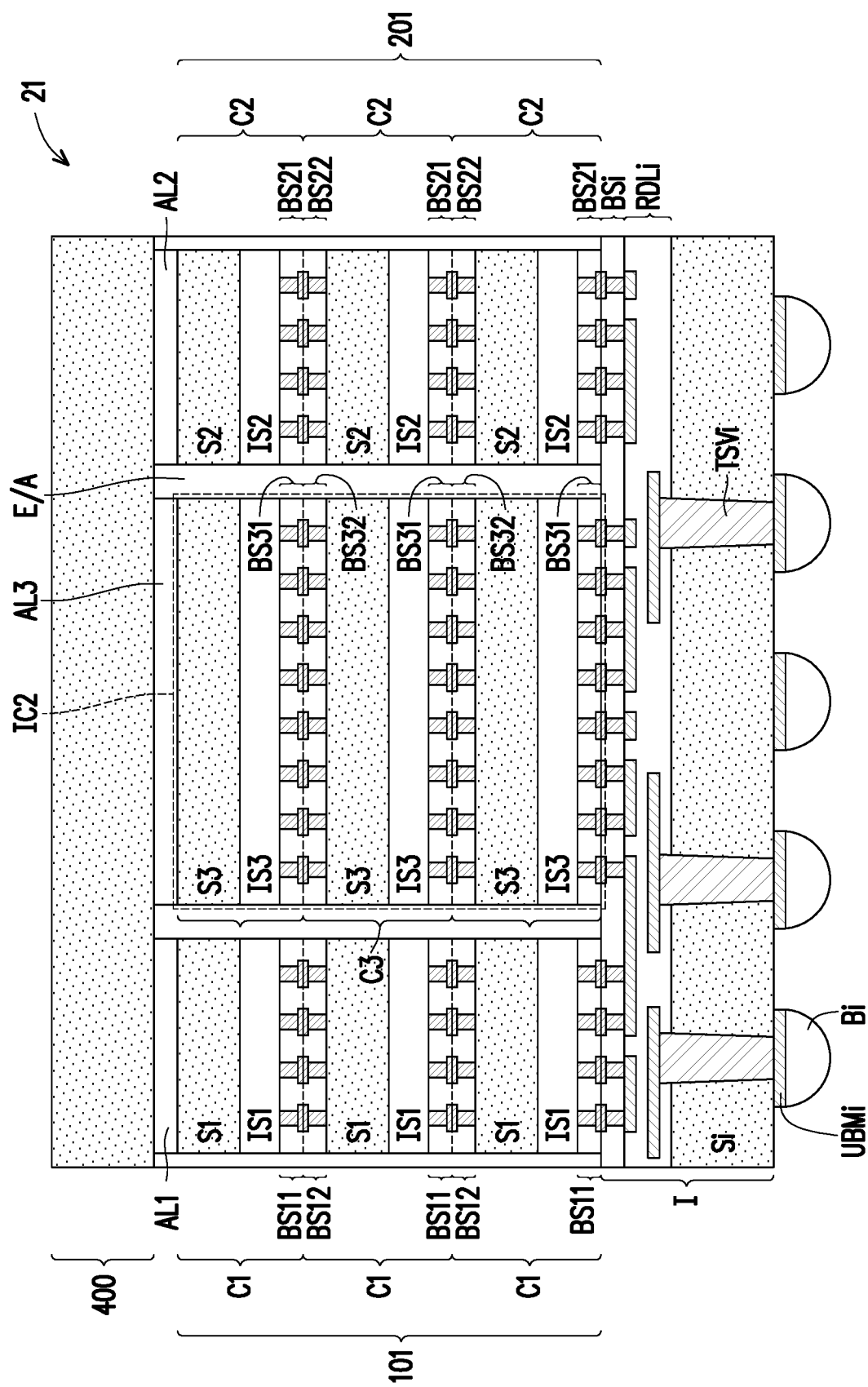
Figure 12:
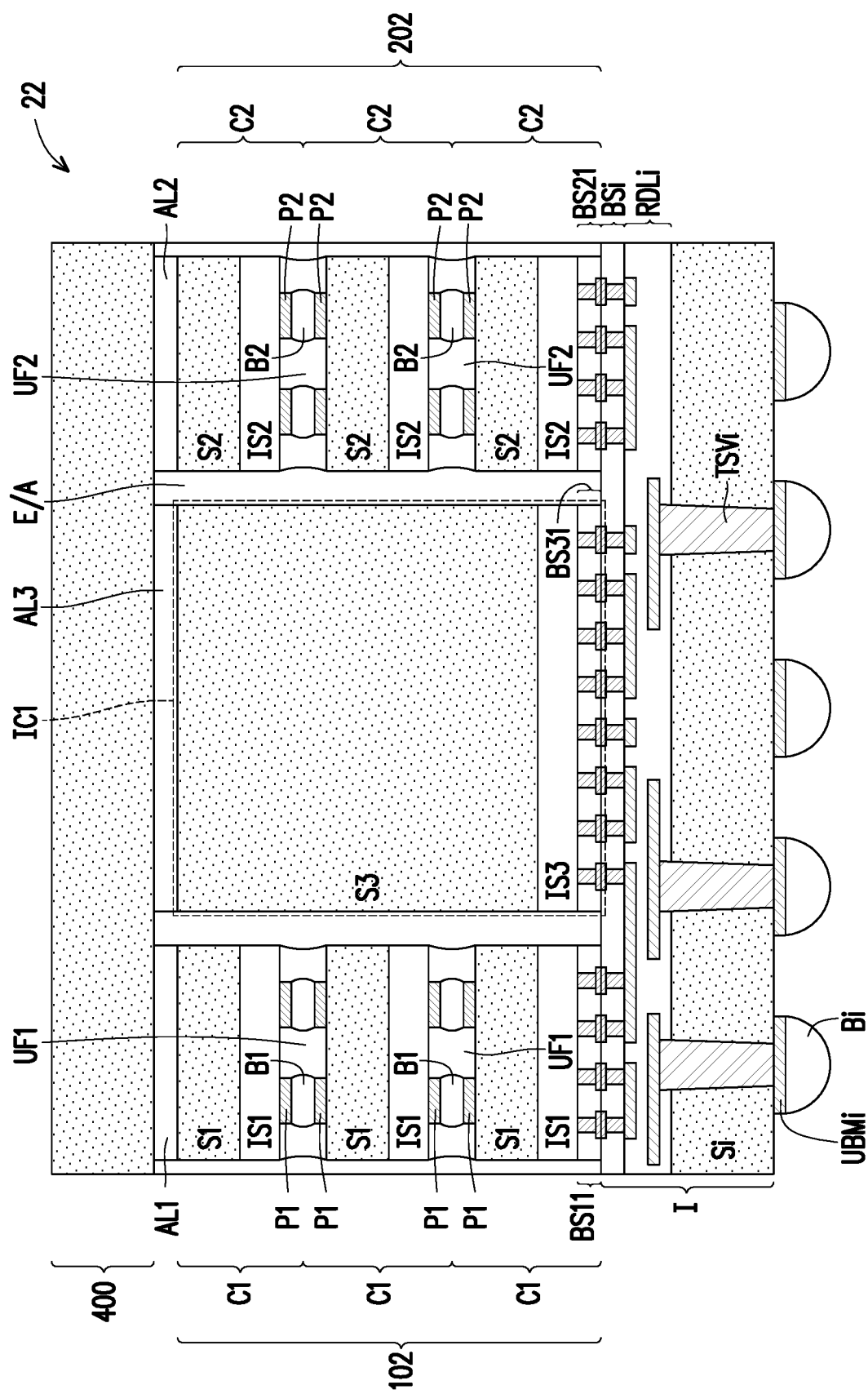
Figure 13:
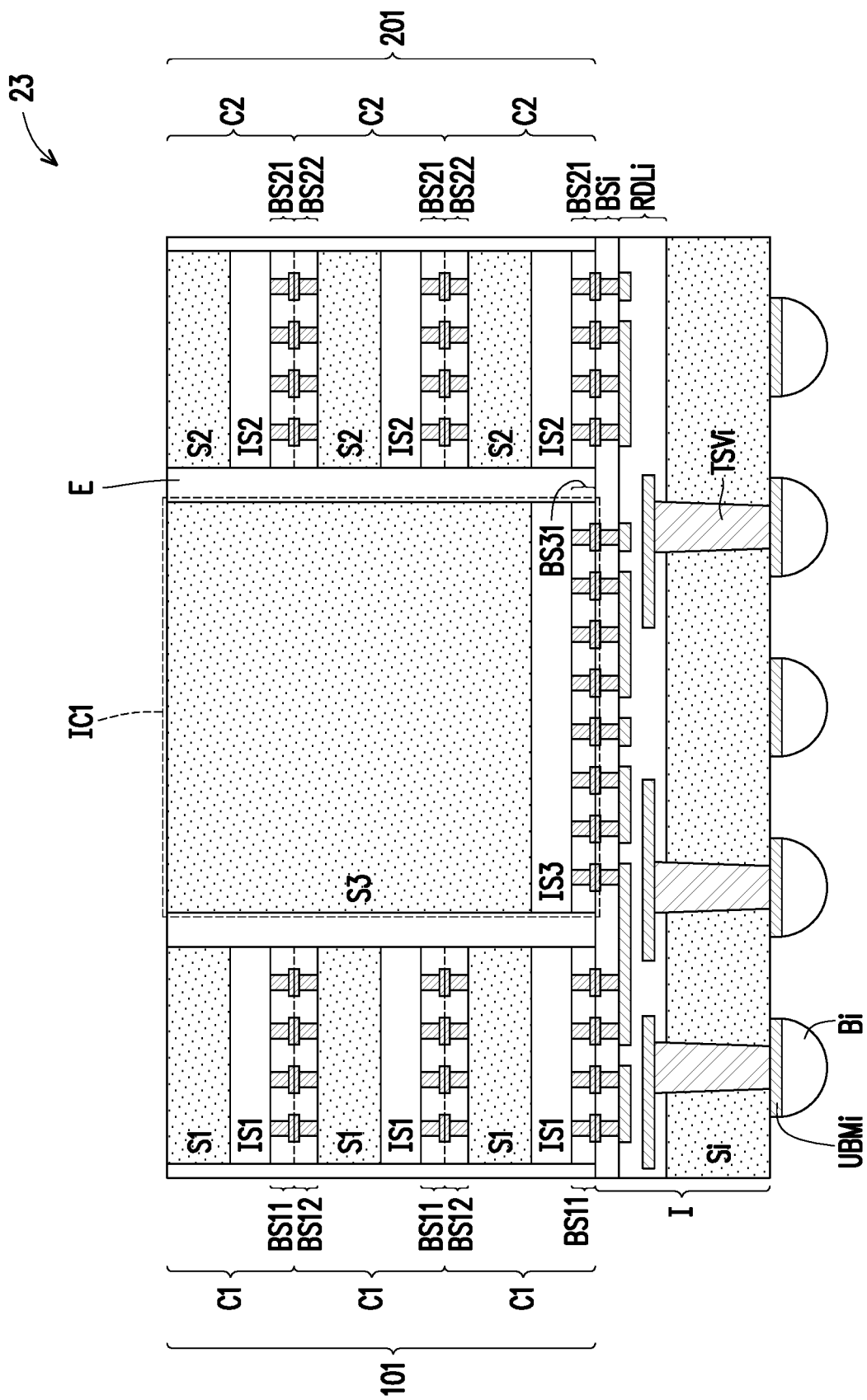
Figure 14:
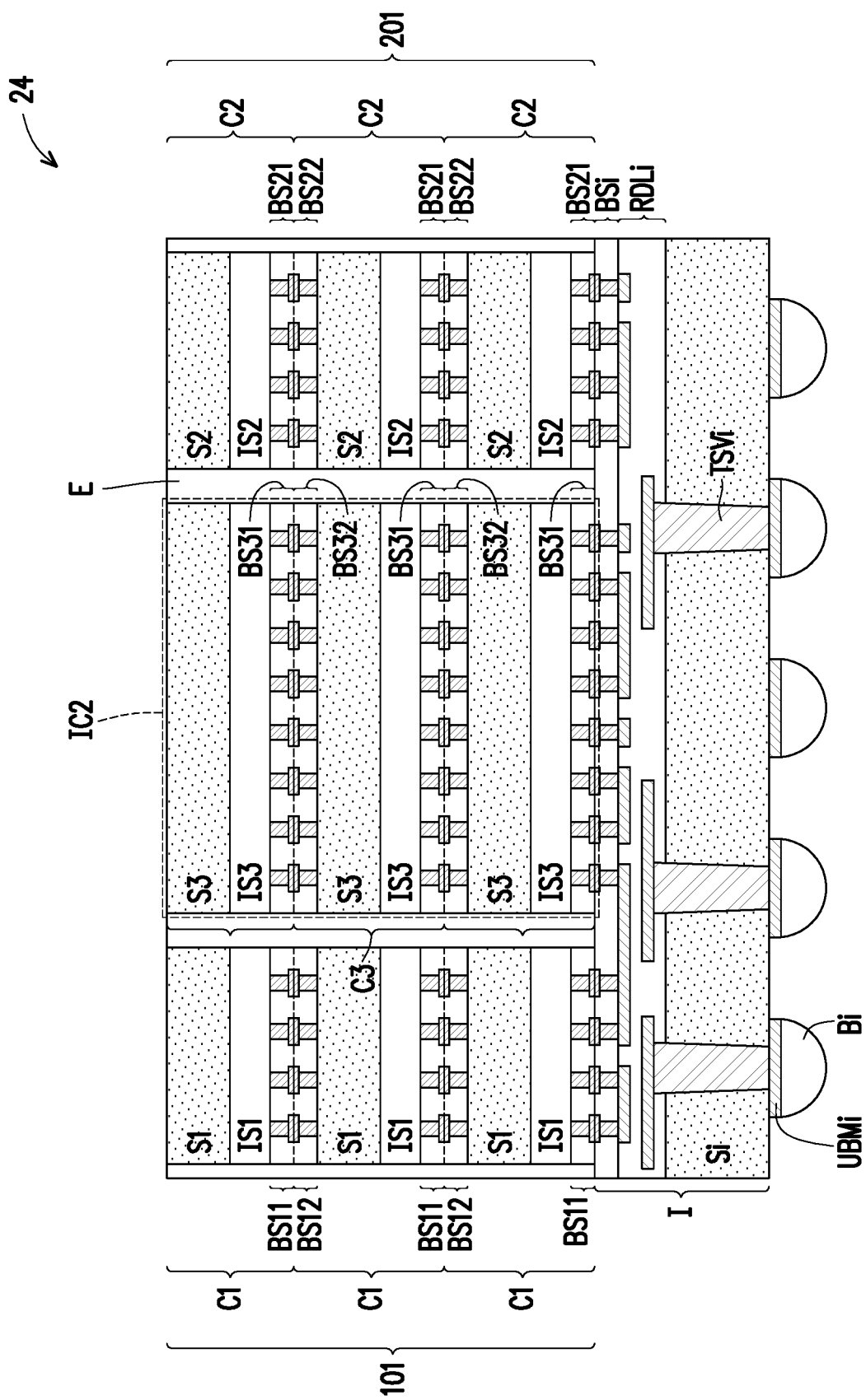
Figure 15:
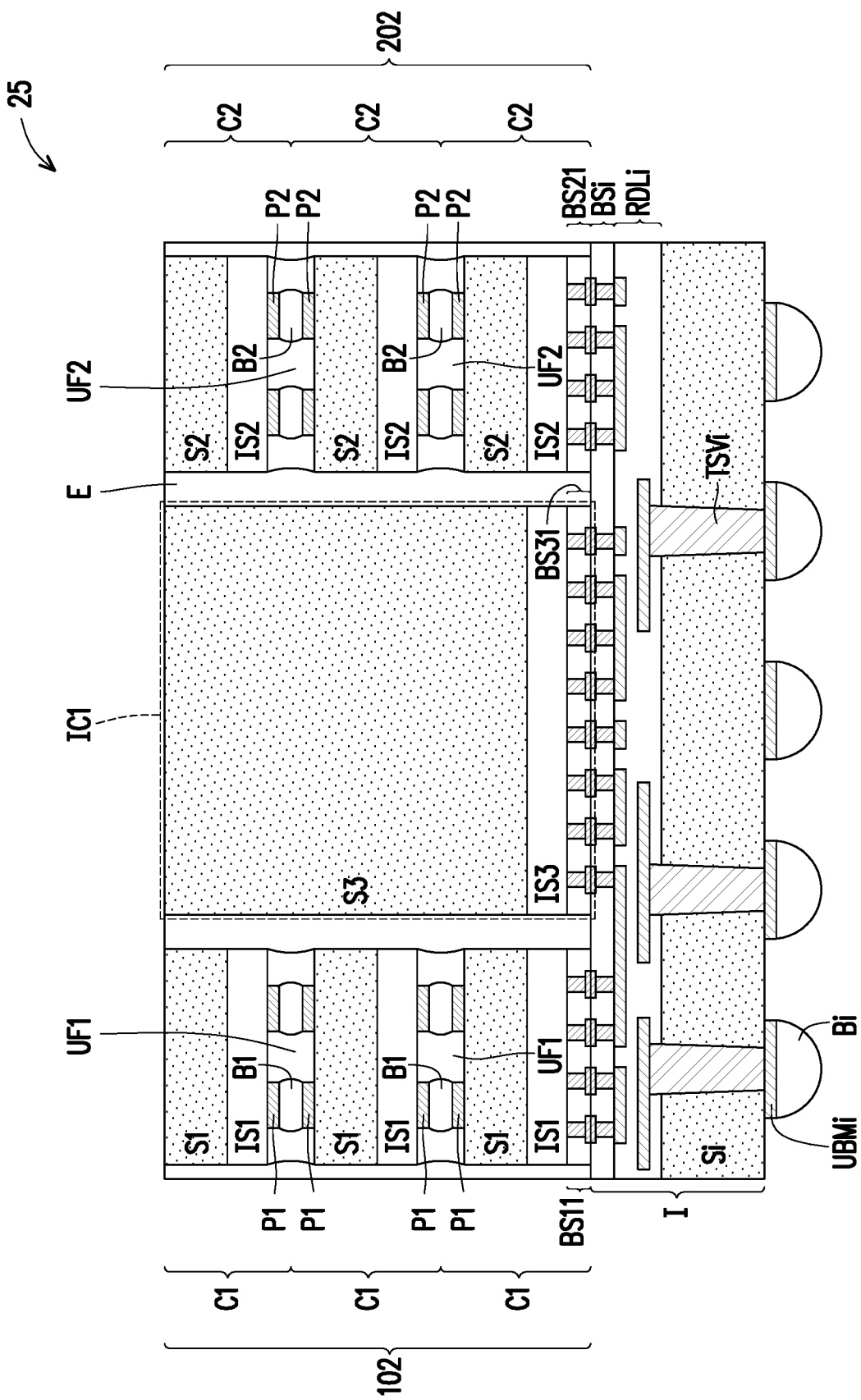

Referring to FIG. 9D, bumps Bi are formed to electrically connect to the redistribution layer structure RDLi. Accordingly, an integrated circuit package having a silicon-free interposer structure is provided. In some embodiments, a cover member 400 is optional formed to cover the tops of the first die stack 101/102, the second die stack 201/202 and the integrated circuit structure IC1/IC2.

Since a silicon substrate is semiconductive, it may adversely affect the performance of the circuits and the connections formed therein and thereon. For example, signal degradation may be caused by the silicon substrate. In some embodiments of the disclosure, a silicon-free interposer structure is provided, and such silicon-free interposer structure is beneficial to reduce the package size, decrease the signal degradation and improve the package performance. In some embodiments, two or more die stacks are bonded to the interposer structure through a hybrid bonding instead of the conventional solder joint, so the package size can be further reduced.

FIG. 10 to FIG. 15 are cross-sectional views of various integrated circuit packages in accordance with yet alternative embodiments.

The integrated circuit packages 20-25 of FIGS. 10-15 are similar to the integrated circuit packages 10-15 of FIGS. 3-8, the difference between them lies in that, the interposer structure I of each of the integrated circuit packages 10-15 of FIGS. 3-8 is a silicon-free interposer, while the interposer structure I of each of the integrated circuit packages 20-25 of FIGS. 10-15 is a silicon-containing interposer. In some embodiments, the interposer structure I of each of the integrated circuit packages 20-25 of FIGS. 10-15 includes a semiconductor substrate Si, through substrate vias TSVi, a redistribution layer structure RDLi and a blanket bonding structure BSi. In some embodiments, the through substrate vias TSVi extend into the redistribution layer structure RDLi and land on the metal pads of the redistribution layer structure RDLi.

In some embodiments, under bump metallization pads UBMi and bumps Bi are further included in the interposer structure I of each of the integrated circuit packages 20-25 of FIGS. 10-15. The under bump metallization pads UBMi and bumps Bi are electrically connected to the redistribution layer structure RDLi.

Figure 16A:
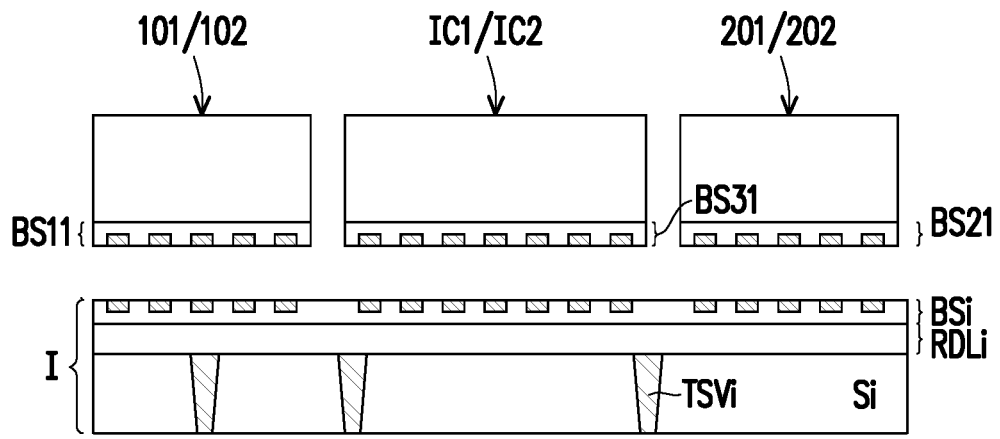
FIG. 16A to FIG. 16C are simplified cross-sectional views of a method of forming an integrated circuit package in accordance with yet alternative embodiments.
Figure 16B:
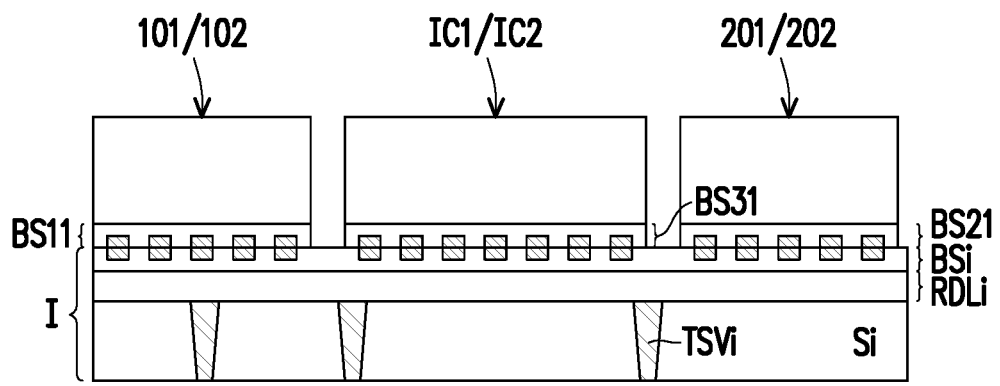
Figure 16C:
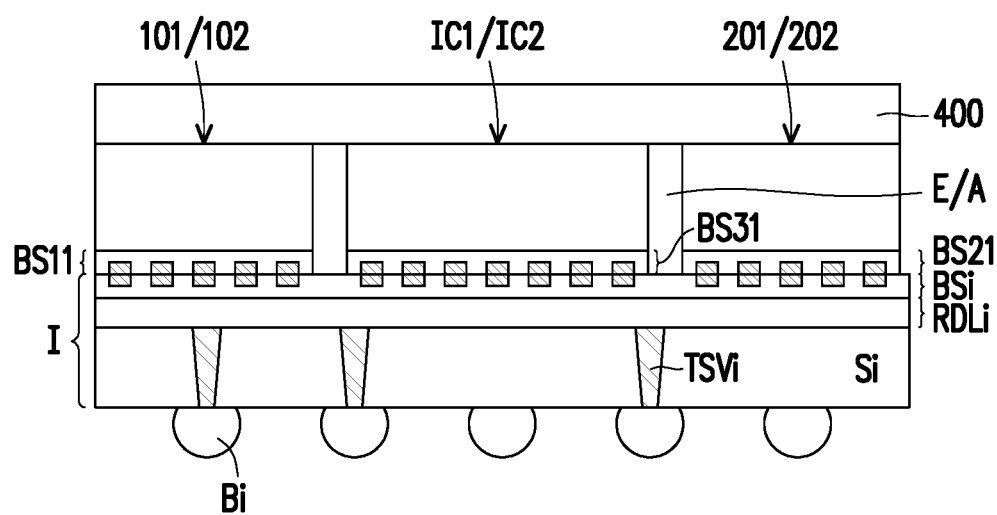

FIG. 16A to FIG. 16C are simplified cross-sectional views of a method of forming an integrated circuit package in accordance with yet alternative embodiments. For simplicity and clarity of illustration, only few elements are shown in the cross-sectional views of FIG. 16A to FIG. 16C. It is understood that the disclosure is not limited by the method described below. Additional operations can be provided before, during, and/or after the method and some of the operations described below can be replaced or eliminated, for additional embodiments of the methods.

Referring to FIG. 16A, an interposer structure I is provided. In some embodiments, the interposer structure I includes a semiconductor substrate Si, a redistribution layer structure RDLi over the semiconductor substrate Si, and a blanket bonding structure BSi over the redistribution layer structure RDLi. In some embodiments, the semiconductor substrate Si includes through substrate vias TSVi such as through silicon vias.

Thereafter, a first die stack 101/102 having a bonding structure B11, a second die stack 201/202 having a bonding structure BS 21 and an integrated circuit structure IC1/IC2 having a bonding structure BS31 are provided over the interposer structure I.

Referring to FIG. 16B, the first die stack 101/102, the second die stack 201/202 and the integrated circuit structure IC1/IC2 are bonded to the interposer structure I through a hybrid bonding comprising a metal-to-metal bonding and a dielectric-to-dielectric bonding. In some embodiments, the respective bonding structures BS11, BS21 and BS31 of the first die stack 101/201, the second die stack 201/202 and the integrated circuit structure IC1/IC2 are bonded to the blanket bonding structure BSi of the interposer structure I.

Referring to FIG. 16C, bumps Bi are formed to electrically connect to the through silicon vias TSVi and therefore the redistribution layer structure RDLi. Accordingly, an integrated circuit package having a silicon-containing interposer structure is provided. In some embodiments, a cover member 400 is optional formed to cover the tops of the first die stack 101/102, the second die stack 201/202 and the integrated circuit structure IC1/IC2.

In some embodiments, two or more die stacks are bonded to the interposer structure through a hybrid bonding instead of the conventional solder joint, so the package size can be further reduced.

Many variations of the above examples are contemplated by the present disclosure. It is understood that different embodiments may have different advantages, and that no particular advantage is necessarily required of all embodiments.

In accordance with some embodiments of the present disclosure, an integrated circuit package includes an integrated circuit structure, a first die stack and a dummy die. The first die stack includes a plurality of first die structures and is bonded to the integrated circuit structure at a first side of the first die stack. The dummy die includes a plurality of through substrate vias, is located aside the first die stack and is electrically connected to the integrated circuit structure at the first side of the first die stack. In some embodiments, the height of the through substrate vias of the dummy die is the same as the height of the first die stack.

In accordance with alternative embodiments of the present disclosure, an integrated circuit package includes an interposer structure, a first die stack and a second die stack. The first die stack includes a plurality of first die structures and is bonded to the interposer structure through a hybrid bonding including a metal-to-metal bonding and a dielectric-to-dielectric bonding. The second die stack includes a plurality of second die structures and is bonded to the interposer structure through a hybrid bonding including a metal-to-metal bonding and a dielectric-to-dielectric bonding.

In accordance with yet alternative embodiments of the present disclosure, a method of forming an integrated circuit package includes following operations. An interposer structure having a blanket bonding structure is provided. A first die stack having a first bonding structure, a second die stack having a second bonding structure and an integrated circuit structure having a third bonding structure are provided. The first die stack, the second die stack and the integrated circuit structure are bonded to the interposer structure through a hybrid bonding comprising a metal-to-metal bonding and a dielectric-to-dielectric bonding, wherein the first, second and third bonding structures of the first die stack, the second die stack and the integrated circuit structure are bonded to the blanket bonding structure of the interposer structure. A silicon portion of the interposer structure is removed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising:
    a silicon-containing interposer structure having an interposer bonding dielectric layer, interposer bonding pads, interposer bonding vias respectively connected to the interposer bonding pads, and a redistribution layer structure disposed below the interposer bonding dielectric layer, wherein the interposer bonding dielectric layer laterally surrounds the interposer bonding pads and the interposer bonding vias, the redistribution layer structure has redistribution features confined to at least one polymer layer, and the at least one polymer layer is disposed below the interposer bonding dielectric layer;
    a first die stack, comprising a plurality of first die structures, wherein a first die structure of the first die stack facing the silicon-containing interposer structure has a first bonding pad, a first bonding via connected to the first bonding pad, and a first bonding dielectric layer surrounding the first bonding pad and the first bonding via, the first bonding pad is connected to a first one of the interposer bonding pads, and the first bonding dielectric layer is connected to the interposer bonding dielectric layer; and
    a bulk die, located aside the first die stack, wherein the bulk die has a second bonding pad, a second bonding via connected to the second bonding pad, and a second bonding dielectric layer surrounding the second bonding pad and the second bonding via, the second bonding pad is connected to a second one of the interposer bonding pads, and the second bonding dielectric layer is connected to the interposer bonding dielectric layer,
    wherein interconnect structures of the bulk die and the first die structure of the first die stack facing the silicon-containing interposer structure have substantially the same thickness, while semiconductor substrates of the bulk die and the first die structure of the first die stack facing the silicon-containing interposer structure have different thicknesses,
    wherein the integrated circuit package further comprises a bulk cover member disposed over the first die stack and the bulk die,
    wherein a first adhesive layer is disposed between the bulk cover member and the first die stack and a second adhesive layer is disposed between the bulk cover member and the bulk die, a dielectric encapsulation extends from a sidewall of the bulk die and completely fills in a gap between the first adhesive layer and the second adhesive layer, and a gap between the bulk die and first die stack,
    wherein the dielectric encapsulation directly contacts the bulk cover member, and an interface is present between the dielectric encapsulation and the first adhesive layer or the second adhesive layer, and
    wherein a distance of the sidewall of the cover member to the outer sidewall of the first die stack is less than a distance of the inner sidewall of the first die stack to the sidewall of the bulk die.

2. The integrated circuit package of claim 1, wherein a height of the first die stack is the same as a height of the bulk die.

3. The integrated circuit package of claim 1, wherein the sidewall of the first die stack is flushed with a sidewall of the second adhesive layer.

4. The integrated circuit package of claim 1, wherein the dielectric encapsulation directly contacts the plurality of first die structures of the first die stack and the bulk die.

5. The integrated circuit package of claim 1, further comprising a second die stack aside the bulk die, wherein the second die stack comprises a plurality of second die structures, wherein a second die structure of the second die stack facing the silicon-containing interposer structure has a third bonding pad, a third bonding via connected to the third bonding pad, and a third bonding dielectric layer surrounding the third bonding pad and the third bonding via, the third bonding pad is connected to a third one of the interposer bonding pads, and the third bonding dielectric layer is connected to the interposer bonding dielectric layer.

6. The integrated circuit package of claim 1, wherein the first and second adhesive layers comprise an oxide layer or a die attach tape.

7. The integrated circuit package of claim 1, wherein the first die stack has an outer sidewall and an inner sidewall opposite to each other, the inner sidewall of the first die stack faces the sidewall of the bulk die, and a sidewall of the cover member extends outwardly from the outer sidewall of the first die stack.

8. The integrated circuit package of claim 1, wherein first bonding pads of two adjacent first die structures in the first die stack are connected to each other, and first bonding dielectric layers of the two adjacent first die structures in the first die stack are connected to each other.

9. The integrated circuit package of claim 1, wherein solder balls of two adjacent first die structures in the first die stack are connected to each other.

10. An integrated circuit package, comprising:
    an interposer structure;
    two die stacks, respectively bonded to the interposer structure, wherein each of the die stacks comprises a plurality of die structures, the die structure facing the interposer structure has two bonding structures on front and back sides thereof, and the die structure facing away from the interposer structure has one bonding structure on one of the front and back sides thereof, wherein the bonding structure of each of the die structures facing the interposer structure has a bonding pad, a bonding via connected to the bonding pad, and a bonding dielectric layer surrounding the bonding pad and the bonding via, wherein the interposer structure has an interposer bonding dielectric layer, interposer bonding pads, interposer bonding vias respectively connected to the interposer bonding pads, and a redistribution layer structure disposed below the interposer bonding dielectric layer, wherein the interposer bonding dielectric layer laterally surrounds the interposer bonding pads and the interposer bonding vias, the bonding pads of the die stacks are connected to the interposer bonding pads, and the bonding dielectric layers of the die stacks are connected to the interposer dielectric layer, and wherein the redistribution layer structure has redistribution features confined to at least one polymer layer, and the at least one polymer layer is disposed below the interposer bonding dielectric layer; and a cover member disposed over the two die stacks, wherein a gap between the die stacks is filled with air, and entire sidewalls of each of the two die stacks are exposed to air.

11. The integrated circuit package of claim 10, wherein the interposer structure is a silicon-free interposer.

12. The integrated circuit package of claim 10, further comprising two adhesive layers disposed between the cover member and the two die stacks, wherein entire sidewalls of each of the two adhesive layers are exposed to air.

13. The integrated circuit package of claim 10, wherein sidewalls of the die structures in each of the die stacks are coplanar with each other.

14. The integrated circuit package of claim 10, wherein a sidewall of the cover member is flushed with a sidewall of the interposer structure.

15. An integrated circuit package, comprising:

a redistribution layer structure free of a silicon substrate;

a bonding structure disposed over and electrically connected to a first side of the redistribution layer structure and having bonding pads, bonding vias respectively connected to the bonding pads, and a zeroth bonding dielectric layer surrounding the bonding pads and the bonding vias;

a first die, having a first bonding pad, a first bonding via connected to the first bonding pad, and a first bonding dielectric layer surrounding the first bonding pad and the first bonding via, wherein the first bonding pad is connected to one of the bonding pads of the bonding structure, and the first bonding dielectric layer is connected to the zeroth bonding dielectric layer of the bonding structure; and a second die, having a second bonding pad, a second bonding via connected to the second bonding pad, and a second bonding dielectric layer surrounding the second bonding pad and the second bonding via, wherein the second bonding pad is connected to another of the bonding pads of the bonding structure, and the second bonding dielectric layer is connected to the zeroth bonding dielectric layer of the bonding structure, wherein the bonding structure is disposed between the redistribution layer structure and each of the first die and the second die, the redistribution layer structure has redistribution features confined to at least one polymer layer, and the at least one polymer layer is disposed below the zeroth bonding dielectric layer, wherein a plurality of bumps physically contact and are electrically connecting a second side of the redistribution layer structure opposite to the first side, and wherein a gap between the first and second dies is filled with air, and entire sidewalls of each of the first and second dies are exposed to the air.

16. The integrated circuit package of claim 15, further comprising a cover member disposed over the first die and the second die, wherein a first adhesive layer is disposed between the cover member and the first die stack and a second adhesive layer is disposed between the cover member and the bulk die.

17. The integrated circuit package of claim 16, wherein the cover member is a device-free member.

18. The integrated circuit package of claim 16, wherein the cover member is a device-containing member.

19. The integrated circuit package of claim 16, wherein a width of the gap between the first and second dies ranges from 10 μm to 70 μm, and the width of the gap between the first and second dies is greater than a distance of the sidewall of the cover member to an outer sidewall of the first die stack.

20. The integrated circuit package of claim 1, wherein a sidewall of the bulk cover member is overlapped with a sidewall of the silicon-containing interposer structure.

* * * * *